(12) United States Patent
Matsuda et al.

(10) Patent No.: US 10,527,664 B2
(45) Date of Patent: Jan. 7, 2020

(54) NOISE SOURCE ANALYSIS METHOD

(71) Applicant: TOSHIBA MITSUBISHI-ELECTRIC INDUSTRIAL SYSTEMS CORPORATION, Chuo-ku (JP)

(72) Inventors: Shigehiko Matsuda, Tokyo (JP); Norihiro Suzuki, Tokyo (JP); Noriyuki Maehata, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 152 days.

(21) Appl. No.: 15/566,114

(22) PCT Filed: May 29, 2015

(86) PCT No.: PCT/JP2015/065604
§ 371 (c)(1),
(2) Date: Oct. 12, 2017

(87) PCT Pub. No.: WO2016/194058
PCT Pub. Date: Dec. 8, 2016

(65) Prior Publication Data
US 2018/0095120 A1 Apr. 5, 2018

(51) Int. Cl.
*G01R 29/26* (2006.01)
*G01R 29/08* (2006.01)

(52) U.S. Cl.
CPC ......... *G01R 29/26* (2013.01); *G01R 29/0878* (2013.01)

(58) Field of Classification Search
CPC .............. G01R 29/26; G01R 29/0878

USPC .................................. 324/613–614
See application file for complete search history.

(56) References Cited

U.S. PATENT DOCUMENTS

| | | | |
|---|---|---|---|
| 8,427,333 B2* | 4/2013 | Kraemer | G01R 29/0842 324/72 |
| 2005/0100172 A1* | 5/2005 | Schliep | G08G 1/01 381/71.4 |
| 2005/0213432 A1* | 9/2005 | Hoshuyama | H04M 1/03 367/129 |
| 2008/0250366 A1* | 10/2008 | Ishikawa | G01R 31/31709 716/115 |

(Continued)

FOREIGN PATENT DOCUMENTS

| | | |
|---|---|---|
| CN | 101937025 A | 1/2011 |
| JP | 62-16017 A | 1/1987 |

(Continued)

OTHER PUBLICATIONS

English translation of the International Preliminary Report on Patentability and Written Opinion of the International Searching Authority dated Dec. 14, 2017 in PCT/JP2015/065604 filed May 29, 2015, 8 pages.

(Continued)

*Primary Examiner* — Jeff W Natalini
(74) *Attorney, Agent, or Firm* — Oblon, McClelland, Maier & Neustadt, L.L.P.

(57) ABSTRACT

The present application provides a noise source analysis method including measuring a noise using voltage sensors 2a and 2b which are time-synchronized with each other and making an analysis to identify a noise source which is a cause of noise based on data of the noise measured by the voltage sensors 2a and 2b.

11 Claims, 20 Drawing Sheets 2a, 2b  voltage sensor
3a, 3b  optical signal processor
4       data collection apparatus
5       noise source analysis apparatus

(56) References Cited

U.S. PATENT DOCUMENTS

| | | | | |
|---|---|---|---|---|
| 2011/0015898 A1* | 1/2011 | Klippel | ............... | H04R 29/001 |
| | | | | 702/185 |
| 2013/0003591 A1* | 1/2013 | Novak | ............... | H04W 72/085 |
| | | | | 370/252 |
| 2015/0161322 A1* | 6/2015 | Yoshino | ............. | G06F 17/5036 |
| | | | | 716/115 |
| 2016/0308580 A1* | 10/2016 | Alloin | ..................... | H04B 3/32 |

FOREIGN PATENT DOCUMENTS

| | | |
|---|---|---|
| JP | 4-264699 A | 9/1992 |
| JP | 6-118119 A | 4/1994 |
| JP | 2006-258729 A | 9/2006 |
| JP | 2010-218056 A | 9/2010 |
| JP | 2010-271104 | 12/2010 |
| WO | 2009/144820 A1 | 12/2009 |

OTHER PUBLICATIONS

Office Action dated Jan. 25, 2019 in Korean Patent Application No. 10-2017-7033026 (with unedited computer generated English translation).

Office Action dated Jun. 5, 2018 in Japanese Patent Application No. 2017-521327 (with English translation).

Office Action dated Jan. 8, 2019 in Japanese Patent Application No. 2017-521327 (with English translation).

Office Action dated Jun. 26, 2018 in Korean Patent Application No. 10-2017-7033026 (with English language translation).

International Search Report dated Aug. 4, 2015 in PCT/JP2015/065604 filed May 29, 2015.

Combined Office Action and Search Report dated Jun. 3, 2019 in Chinese Patent Application No. 201580080211.3 (with unedited computer generated English translation of the Office Action and English translation of category of cited documents), 33 pages.

\* cited by examiner 2a, 2b  voltage sensor
3a, 3b  optical signal processor
4       data collection apparatus
5       noise source analysis apparatus 2a, 2b  voltage sensor
3a, 3b  optical signal processor
4       data collection apparatus
22      noise source

NOISE SOURCE ANALYSIS METHOD

FIELD

The present invention relates to a noise source analysis method for analyzing a noise source which is a cause of noise.

BACKGROUND

Generally, a variety of methods are known as noise countermeasures. For example, a remote monitoring apparatus is disclosed, which is provided with various sensors inside a control panel and determines, based on data acquired from these sensors, whether an environment inside the control panel is abnormal or not (see PTL 1).

A data collection system is also disclosed, which measures data of physical quantities such as a voltage or current of an electronic apparatus using a plurality of detectors set up in places away from each other, transmits the data to a data collection apparatus through a wireless system, and can collect measured data of the respective detectors at an identical time with an accuracy of 10 nanoseconds or less (see PTL 2).

On the other hand, when an electric wire such as a signal line or DC power line is laid, a noise source such as a relay may be connected to the electric wire. Alternatively, an electric wire including a noise source may be laid in the vicinity of another electric wire and noise may be superimposed on the nearby electric wire by induction. However, there are also electric wires which are laid without a possibility of noise being applied or noise being superimposed by induction. In that case, noise may cause misoperation or the like in an apparatus using the electric wire.

Examples of noise countermeasures include prevention of transmission or induction of noise, increase of noise resistance in apparatuses and measures against noise sources.

Prevention of transmission or induction of noise is often adopted as noise countermeasures, but this involves the following problems. Noise is transmitted in three ways: induction, transmission and electromagnetic wave. Therefore, influences of noise may appear in different places even when certain countermeasures are adopted. Taking full countermeasures requires operation including experience and knowledge, and so a plurality of action plans are executed on a cut-and-try basis, and it takes time until it becomes possible to confirm the results.

For example, a method of shielding an electric wire and leading noise to ground is available as a noise countermeasure. With this method, however, a ground may become a transmission medium of noise from other noise sources or the ground may not have an impedance characteristic low enough to allow a sufficient high frequency current to flow, failing to serve as a noise countermeasure.

On the other hand, increasing the noise resistance of the apparatus requires a cost increase on the apparatus side as a noise countermeasure, and it is often the case that this measure cannot be adopted.

Thus, one of fundamental noise countermeasures is a countermeasure taken on noise source side. Examples of the countermeasures on the noise source side include removal of the noise source and prevention of noise output from the noise source. However, it may be impossible to remove the noise source. For example, the noise source is attributable to a natural phenomenon such as lightning or a breaker or the like to protect devices.

However, in order to take countermeasures on the noise source side, the position of the noise source needs to be identified. A distance over which a noise-carrying electric wire is laid may be as far as several hundreds of meters. Furthermore, the location where an electric wire is laid is often a place where many other electric wires exist such as under a floor or a switchboard. Therefore, identifying the position of the noise source is not easy work.

CITATION LIST

Patent Literature

[PTL 1] WO2009/144820
[PTL 2] JP 2010-218056 A

SUMMARY

It is an object of the present invention to provide a noise source analysis method capable of analyzing a noise source, which is a cause of noise.

A noise source analysis method according to a viewpoint of the present invention includes measuring a noise using a plurality of sensors which are time-synchronized with each other and making an analysis to identify a noise source which is a cause of the noise based on data of the noise measured by the plurality of sensors respectively.

DESCRIPTION OF EMBODIMENTS

First Embodiment

Figure 1:
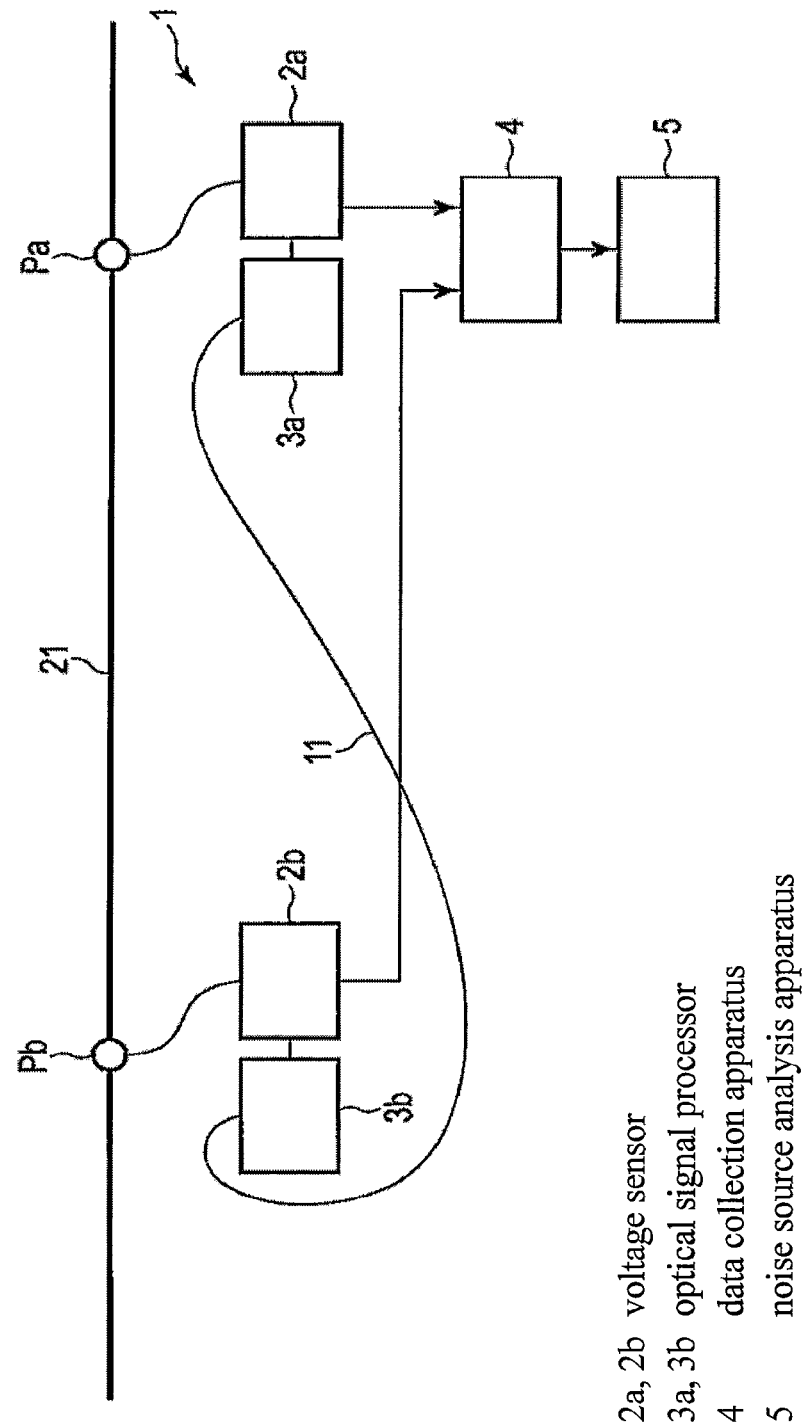
FIG. 1 is a configuration diagram illustrating a configuration of a noise measurement apparatus according to a first embodiment of the present invention.

FIG. 1 is a configuration diagram illustrating a configuration of a noise measurement apparatus 1 according to a first embodiment of the present invention. Note that identical parts among the drawings are assigned identical reference numerals and detailed description thereof is omitted and different parts will be mainly described.

The noise measurement apparatus 1 is provided with two voltage sensors 2a and 2b, two optical signal processors 3a and 3b, a data collection apparatus 4 and a noise source analysis apparatus 5.

The voltage sensors 2a and 2b are sensors that measure a potential (or other electric quantities such as a current) of an electric wire 21 which is a measurement target for analyzing a noise source, which is a cause of noise, as a voltage. The voltage sensors 2a and 2b measure different locations Pa and Pb of the electric wire 21 respectively. The voltage sensors 2a and 2b measure the potential of the electric wire 21 all the time and store measured values at least for a predetermined time period.

When the measured potential exceeds a predetermined threshold, the voltage sensors 2a and 2b detect the excess of the potential as noise. Upon detecting the noise, the voltage sensors 2a and 2b output noise detection signals to the respective optical signal processors 3a and 3b and also record voltage data before and after the times at which the noise is detected. The voltage sensors 2a and 2b output the recorded voltage data to the data collection apparatus 4.

Furthermore, when noise detection signals detected by the other voltage sensors 2a and 2b are inputted to the optical signal processors 3a and 3b, the respective voltage sensors 2a and 2b record voltage data before and after the times at which the noise is detected. The voltage sensors 2a and 2b output the recorded voltage data to the data collection apparatus 4. The times at which the noise is detected here are times in consideration of a delay time required after the noise is detected by the other voltage sensors 2a and 2b until noise detection signals indicating detection of the noise are received. This delay time is set in the voltage sensors 2a and 2b in advance. For example, the respective voltage sensors 2a and 2b determine times, by the delay time before the times at which the noise detection signals are received from the voltage sensors 2a and 2b that detect the noise as the times at which the other voltage sensors 2a and 2b detect the noise.

The optical signal processors 3a and 3b are provided in correspondence with the voltage sensors 2a and 2b respectively. The optical signal processors 3a and 3b perform transmission and reception of an optical signal and other processing. All the optical signal processors 3a and 3b are mutually connected via an optical cable 11. An optical coupler may be connected to the optical cable 11. The optical signal processors 3a and 3b transmit/receive signals for taking time-synchronization between all the voltage sensors 2a and 2b all the time. The optical signal processors 3a and 3b take time-synchronization with accuracy of 10 nanoseconds or less. Upon receiving noise detection signals from the corresponding voltage sensors 2a and 2b, the optical signal processors 3a and 3b transmit noise detection signals to all the other optical signal processors 3a and 3b as optical signals via the optical cable 11. Upon receiving noise detection signals from the other optical signal processors 3a and 3b as optical signals, the respective optical signal processors 3a and 3b output noise detection signals to the corresponding voltage sensors 2a and 2b.

The data collection apparatus 4 collects the voltage data from the voltage sensors 2a and 2b. The data collection apparatus 4 processes the collected voltage data into analysis data for analyzing the noise source. The data collection apparatus 4 outputs the processed analysis data to the noise source analysis apparatus 5.

The noise source analysis apparatus 5 analyzes a noise source based on the analysis data inputted from the data collection apparatus 4. The noise source analysis apparatus 5 outputs information relating to the noise source from the analysis result. For example, the information relating to the noise source is the position and the direction of the noise source.

Note that a part or whole of the processing carried out by the data collection apparatus 4 and the noise source analysis apparatus 5 may be done by human hand.

The following is an overview of a method of analyzing a noise source by the noise source analysis apparatus 5. The speed at which a noise propagates through the electric wire 21 is the speed of light (hereinafter described, unified into 0.2 [m/ns]). When a noise is measured at a plurality of places, a time at which the noise is detected varies from one measurement location to another. A propagation direction and a propagation distance of the noise are determined based on a time difference between these times. The noise source analysis apparatus 5 analyzes the noise source by comparing time series data of voltages indicating the noise measured at respective measurement locations.

Figure 2:
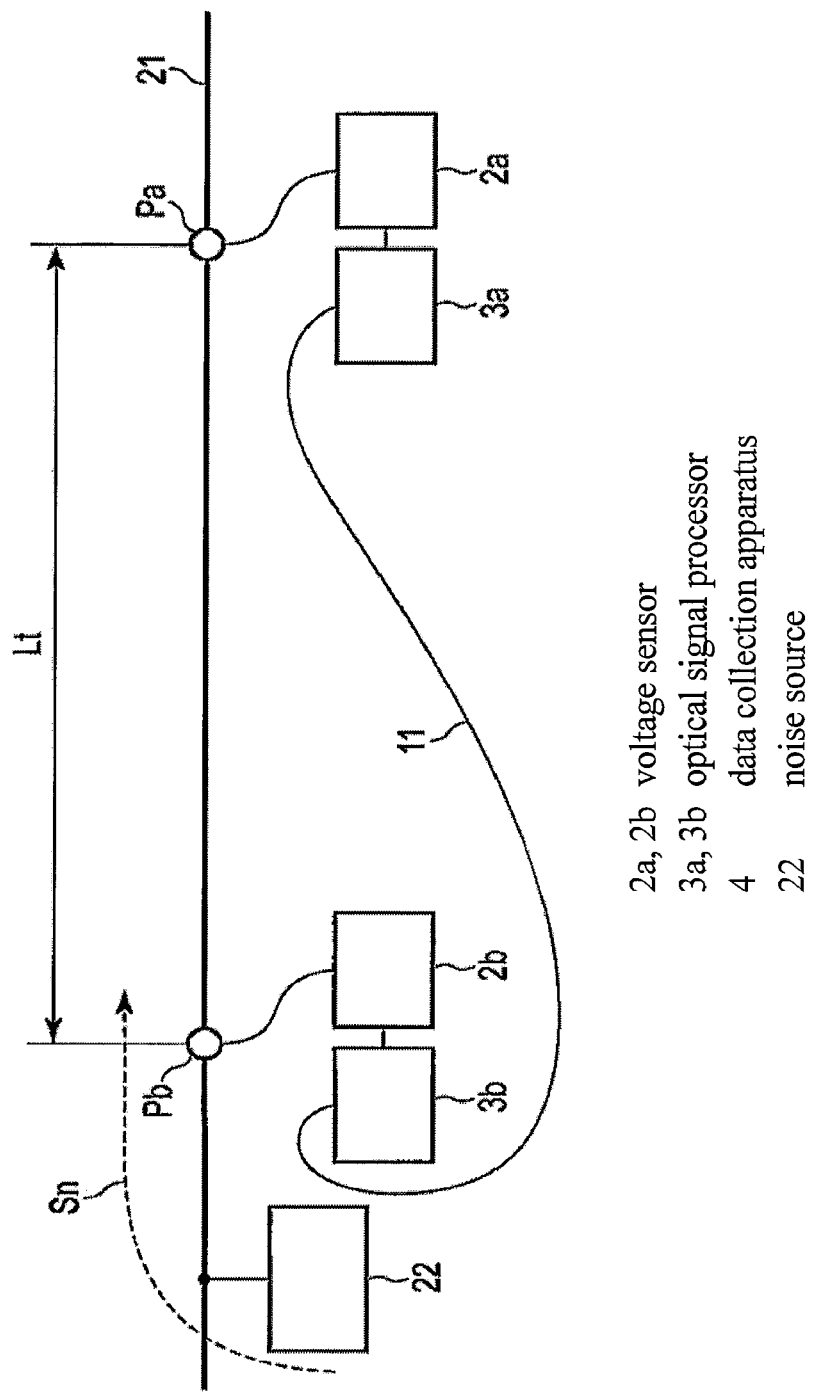
FIG. 2 is a configuration diagram illustrating a configuration in which the noise measurement apparatus according to the present embodiment implements a measurement method.

FIG. 2 is a configuration diagram illustrating a configuration in which the noise measurement apparatus 1 according to the present embodiment implements a measurement method.

Here, a noise source 22 is located outside a space between measurement locations Pa and Pb of the two voltage sensors 2a and 2b. A distance of the electric wire 21 in the space between the measurement locations Pa and Pb of the two voltage sensors 2a and 2b is assumed to be Lt [m]. Suppose the noise source 22 is located outside the space between the measurement locations Pa and Pb of the two voltage sensors 2a and 2b, and on the voltage sensor 2b side. The noise source 22 generates a noise Sn.

Figure 3:
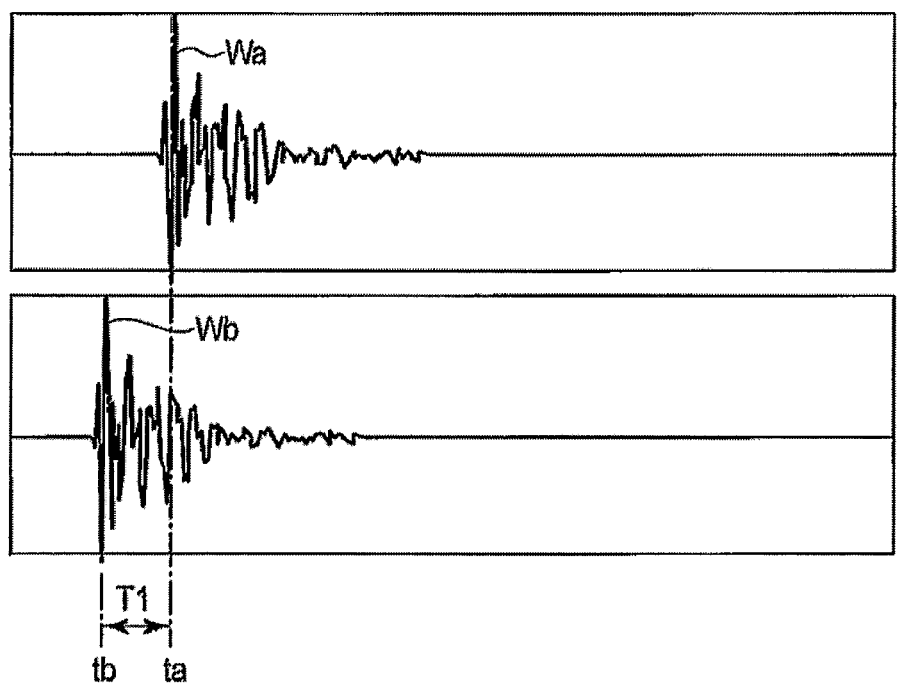
FIG. 3 is a waveform diagram illustrating voltage data measured by the noise measurement apparatus according to the present embodiment.

FIG. 3 is a waveform diagram illustrating voltage data measured by the noise measurement apparatus 1 according to the present embodiment. The waveform diagram shown in FIG. 3 displays two pieces of voltage data measured by the two voltage sensors 2a and 2b respectively on the same time scale.

A waveform Wa is voltage data measured by the voltage sensor 2a located far from the noise source 22. A waveform Wb is voltage data measured by the voltage sensor 2b located near the noise source 22. A time ta represents a time at which the voltage sensor 2a detects the noise Sn (time at which the potential at the measurement location Pa exceeds a threshold). A time tb represents a time at which the voltage sensor 2b detects the noise Sn (time at which the potential at the measurement location Pb exceeds a threshold). A time period T1 represents a time difference between the time ta and the time tb.

The noise source analysis apparatus 5 analyzes the noise source 22 as follows.

When the noise source 22 is located outside the space between the measurement locations Pa and Pb of the two voltage sensors 2a and 2b, the product of the time period T1 which is the time difference between the time ta and the time tb, and the speed of light at which the noise Sn propagates through the electric wire 21 (0.2 [m/ns]) becomes a length Lt of the electric wire 21 between the two measurement locations Pa and Pb. On the other hand, when the noise source 22 is located inside the space between the two measurement locations Pa and Pb, the product of the time period T1 and the speed of light becomes shorter than the length Lt of the electric wire 21. This allows the noise source analysis apparatus 5 to determine whether the noise source 22 is located outside or inside the space between the two measurement locations Pa and Pb. Note that if it is known in advance that the noise source 22 is outside the space between the two measurement locations Pa and Pb, the noise source analysis apparatus 5 need not make any such determination.

Since the time tb is earlier than the time ta, it can be seen that the noise Sn propagates through the electric wire 21 from the direction of the measurement location Pb of the voltage sensor 2b toward the direction of the measurement location Pa of the voltage sensor 2a.

Figure 4:
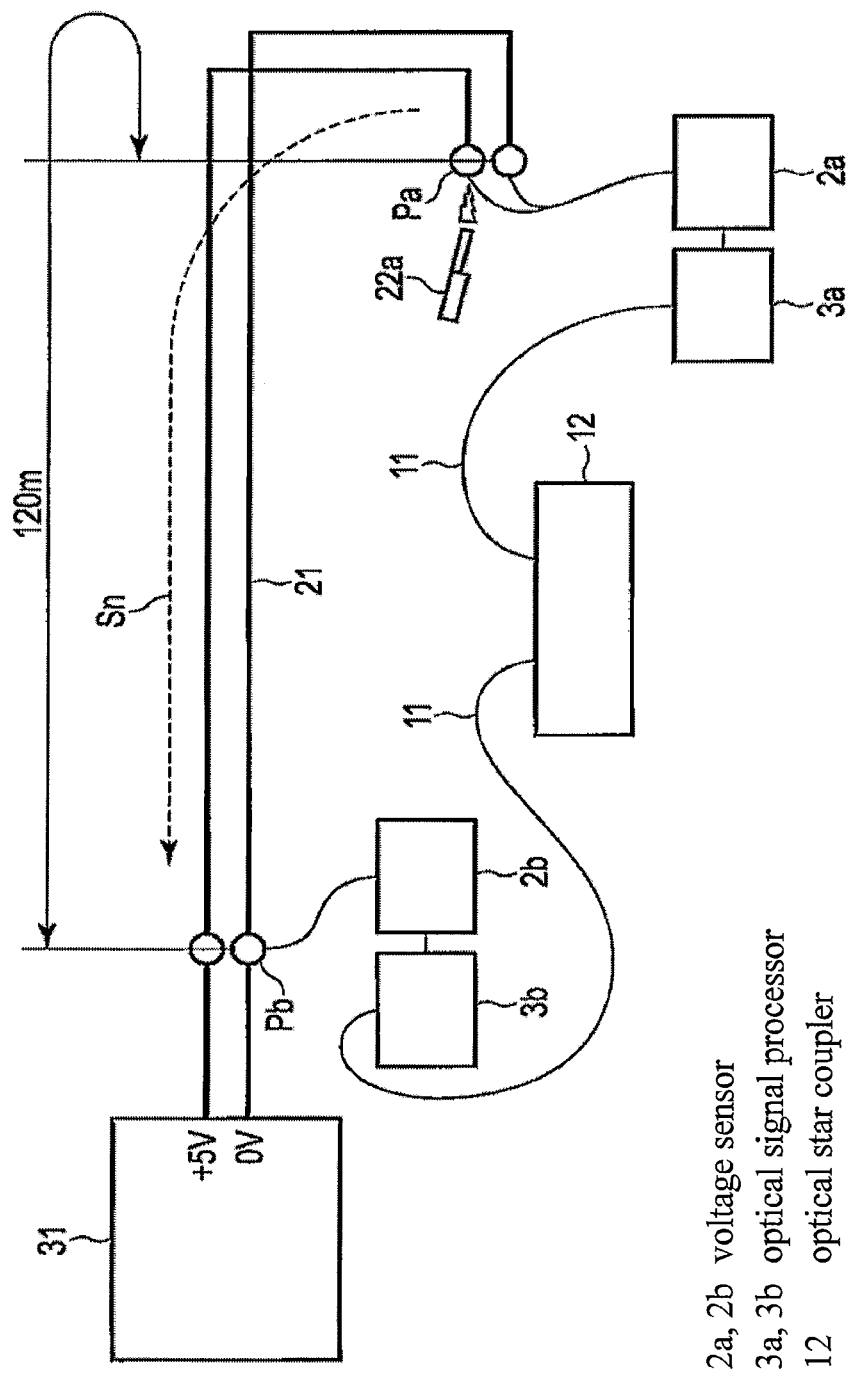
FIG. 4 is a configuration diagram illustrating a configuration in which the noise measurement apparatus according to the present embodiment runs an experiment.

FIG. 4 is a configuration diagram illustrating a configuration in which the noise measurement apparatus 1 according to the present embodiment runs an experiment.

The experiment configuration is as follows. A two-core cable of 120 [m] is used as the electric wire 21. One end of the electric wire 21 is measured by the voltage sensor 2b and the other end of the electric wire 21 is measured by the voltage sensor 2a. A voltage of +5 [V] is applied to the electric wire 21 from a DC power supply 31. Two optical cables 11 that connect the optical signal processors 3a and 3b are connected together via an optical star coupler 12. A noise generator 22a applies the noise Sn to the measurement location Pa of the voltage sensor 2a.

The voltage sensor 2a detects the noise Sn at the time ta and transmits a noise detection signal to the voltage sensor 2b via the optical signal processor 3a, the optical cable 11 on the voltage sensor 2a side, the optical star coupler 12, the optical cable 11 on the voltage sensor 2b side and the optical signal processor 3b sequentially.

Upon receipt of the noise detection signal, the voltage sensor 2b records voltage data before and after a time point tracing back by a time period after detection of the noise Sn by the voltage sensor 2a until the noise detection signal is received. In this way, voltage data measured by the two voltage sensors 2a and 2b nearly at the same time are respectively recorded.

Figure 5:
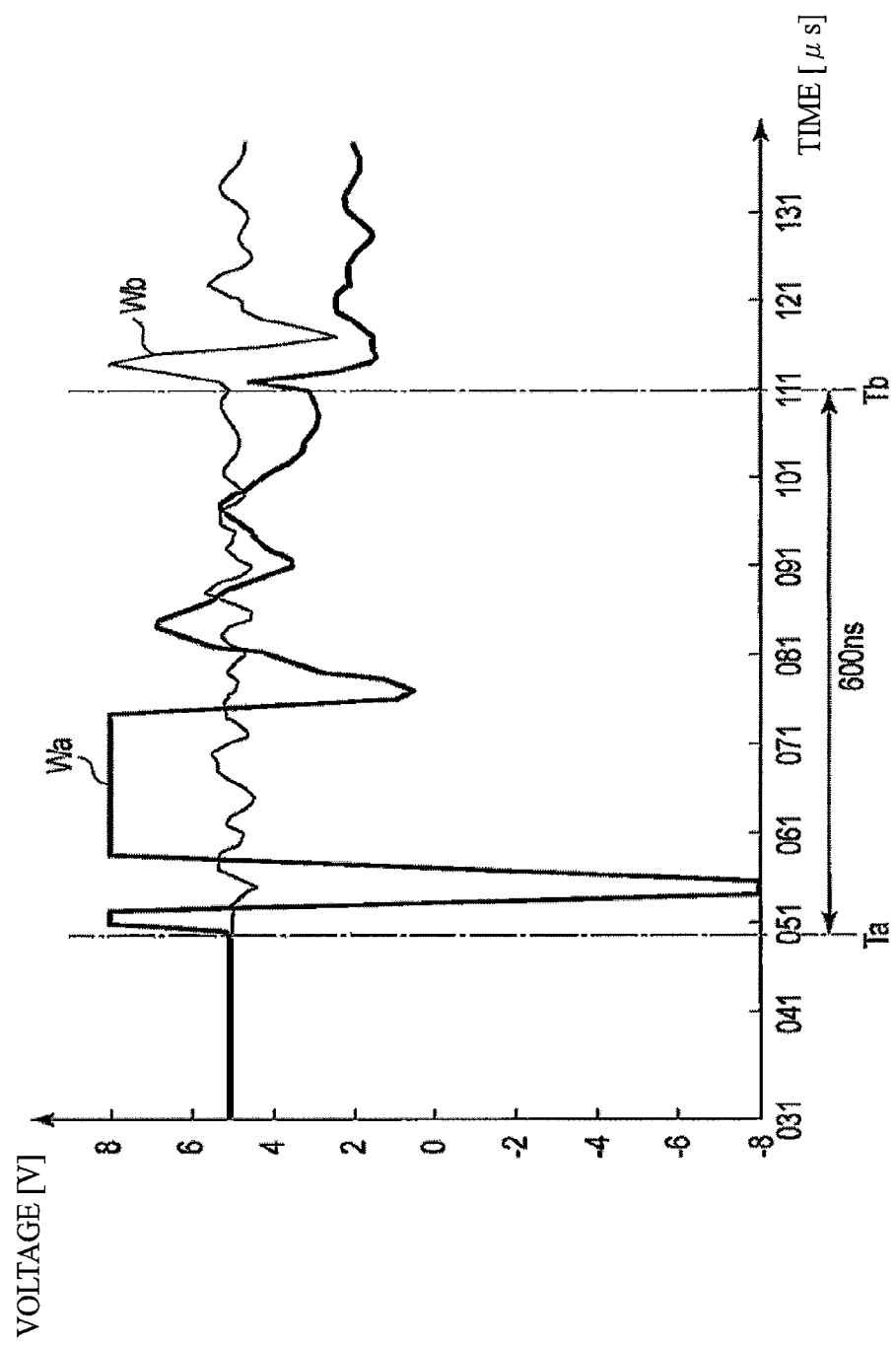
FIG. 5 is a diagram illustrating a trend graph of the voltage data obtained by the experiment shown in FIG. 4.

FIG. 5 is a diagram illustrating a trend graph of the voltage data obtained by the experiment shown in FIG. 4. The graph diagram shown in FIG. 5 is displayed by the noise source analysis apparatus 5.

The time difference between the times ta and tb at which the two voltage sensors 2a and 2b detect the noise Sn respectively is 600 [ns]. The product of this time difference and the speed of light on the electric wire 21 (0.2 [m/ns]) is 600×0.2=120 [m]. This length matches the length of the electric wire 21 that connects the two voltage sensors 2a and 2b. This makes it possible to guess that the noise Sn propagates through the space between the two measurement locations Pa and Pb of the electric wire 21. Furthermore, since the detection time ta of the noise Sn at the measurement location Pa of the voltage sensor 2a is earlier, it can be seen that the noise Sn propagates from the direction of the voltage sensor 2a.

The noise source analysis apparatus 5 outputs the aforementioned analysis process and analysis result or the like.

According to the present embodiment, it is possible to obtain information for identifying the position of the noise source 22 located outside the space between the two measurement locations Pa and Pb of the electric wire 21 by measuring potentials at the two locations Pa and Pb of the electric wire 21 using the two voltage sensors 2a and 2b.

Second Embodiment

Figure 6:
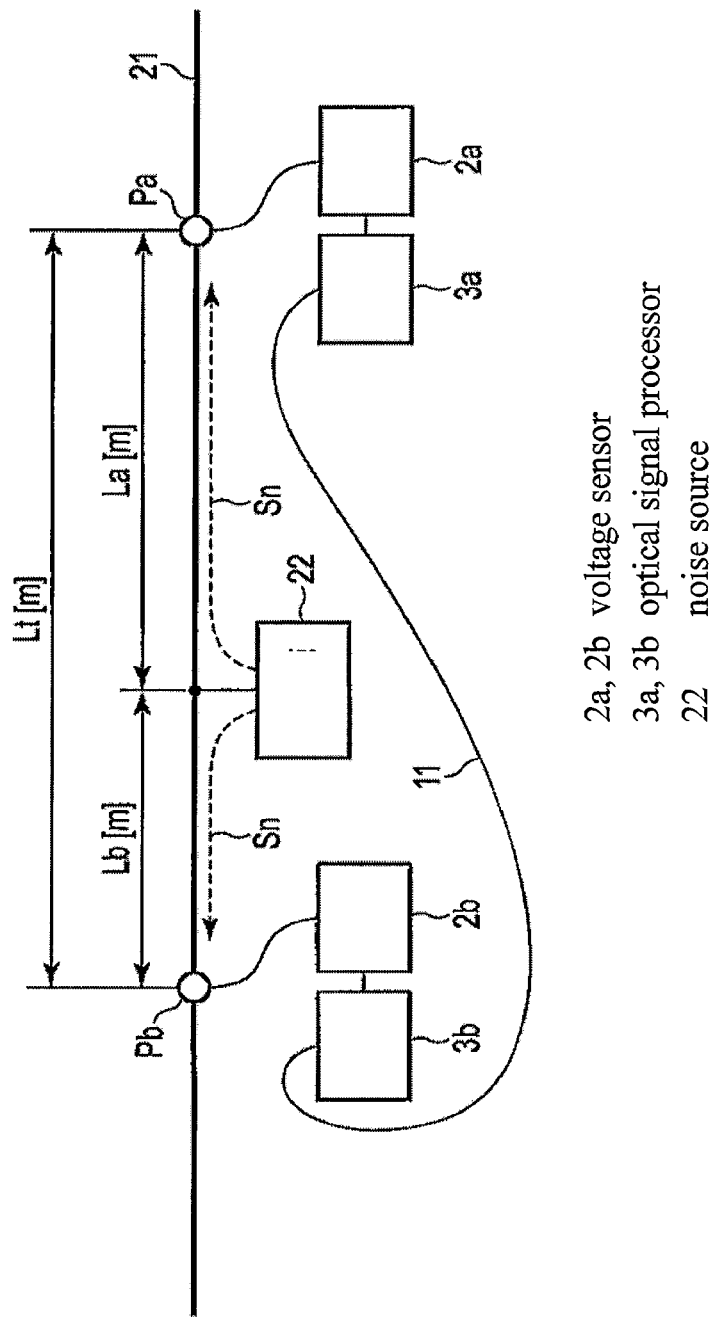
FIG. 6 is a configuration diagram illustrating a configuration in which the noise measurement apparatus according to a second embodiment of the present invention implements a measurement method.

FIG. 6 is a configuration diagram illustrating a configuration in which the noise measurement apparatus 1 according to a second embodiment of the present invention implements a measurement method. A configuration of the noise measurement apparatus 1 according to the present embodiment is similar to the configuration of the noise measurement apparatus 1 according to the first embodiment shown in FIG. 1. Therefore, in FIG. 6, only components necessary for description of the present embodiment are shown and other components are omitted as appropriate.

The noise source 22 is located inside the space between the measurement locations Pa and Pb of the two voltage sensors 2a and 2b. A distance of the electric wire 21 between the measurement locations Pa and Pb of the two voltage sensors 2a and 2b is assumed to be Lt [m]. A distance of the electric wire 21 between the measurement location Pa of the voltage sensor 2a and the noise source 22 is assumed to be La [m]. A distance of the electric wire 21 between the measurement location Pb of the voltage sensor 2b and the noise source 22 is assumed to be Lb [m].

When the noise source 22 generates the noise Sn, the noise Sn propagates at the speed of light in directions on both sides of the electric wire 21. The noise Sn propagating on both sides of the electric wire 21 is detected by the voltage sensors 2a and 2b provided on both sides of the electric wire 21 respectively. As in the case of the first embodiment, the data collection apparatus 4 outputs analysis data to the noise source analysis apparatus 5 based on the voltage data collected by the voltage sensors 2a and 2b.

Figure 7:
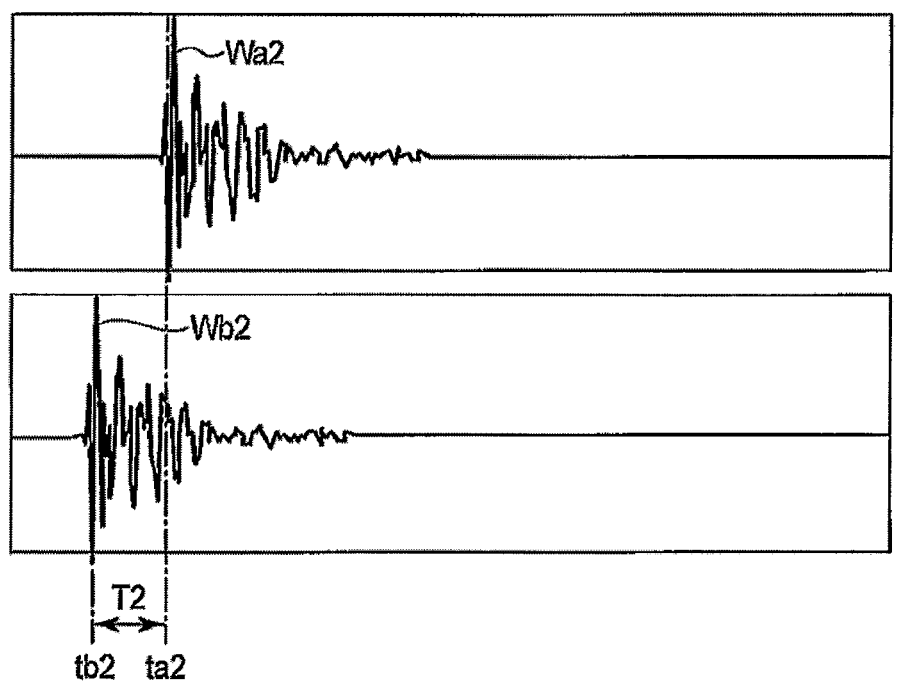
FIG. 7 is a waveform diagram illustrating voltage data measured by the noise measurement apparatus according to the present embodiment.

FIG. 7 is a waveform diagram illustrating voltage data measured by the noise measurement apparatus 1 according to the present embodiment. The waveform diagram shown in FIG. 7 displays two pieces of voltage data measured by the two voltage sensors 2a and 2b respectively on the same time scale.

A waveform Wa2 is voltage data measured by the voltage sensor 2a located far from the noise source 22. A waveform Wb2 is voltage data measured by the voltage sensor 2b located near the noise source 22. A time ta2 represents a time at which the voltage sensor 2a detects the noise Sn (time at which the potential at the measurement location Pa exceeds a threshold). A time tb2 represents a time at which the voltage sensor 2b detects the noise Sn (time at which the potential at the measurement location Pb exceeds a threshold). A time period T2 represents a time difference between the time ta2 and the time tb2.

The noise source analysis apparatus 5 analyzes the noise source 22 based on the analysis data inputted from the data collection apparatus 4 as follows.

As in the case of the first embodiment, the noise source analysis apparatus 5 determines whether or not the noise source 22 is located inside the space between the two measurement locations Pa and Pb.

A time period required for the noise Sn to propagate over the distance Lt between the measurement locations Pa and Pb of the electric wire 21 is calculated from Lt÷speed of light (0.2 [m/ns]). When the time period T2 which is the difference between the two times ta2 and tb2 is shorter than the time calculated, the noise source analysis apparatus 5 determines that the noise source 22 is located inside the space between the two measurement locations Pa and Pb. Note that if it is known in advance that the noise source 22 is located inside the space between the measurement locations Pa and Pb of the two voltage sensors 2a and 2b, the noise source analysis apparatus 5 need not make any such determination.

A difference between distances La and Lb between the noise source 22 and the two measurement locations Pa and Pb is the speed of light×the time period T2. The sum of the two distances La and Lb is the length Lt of the electric wire 21 in the space between the two measurement locations Pa and Pb. From this, the following two equations are obtained.

$$La+Lb=Lt \quad \text{Equation (1)}$$

$$|La-Lb|=\text{speed of light}\times T2 \quad \text{Equation (2)}$$

The two distances La and Lb can be calculated from these equations. The noise source analysis apparatus 5 thereby identifies the position of the noise source 22.

According to the present embodiment, it is possible to obtain information for identifying the position of the noise source 22 located in the space between the two measurement locations Pa and Pb of the electric wire 21 by measuring potentials at the two locations Pa and Pb of the electric wire 21 using the two voltage sensors 2a and 2b.

Third Embodiment

Figure 8:
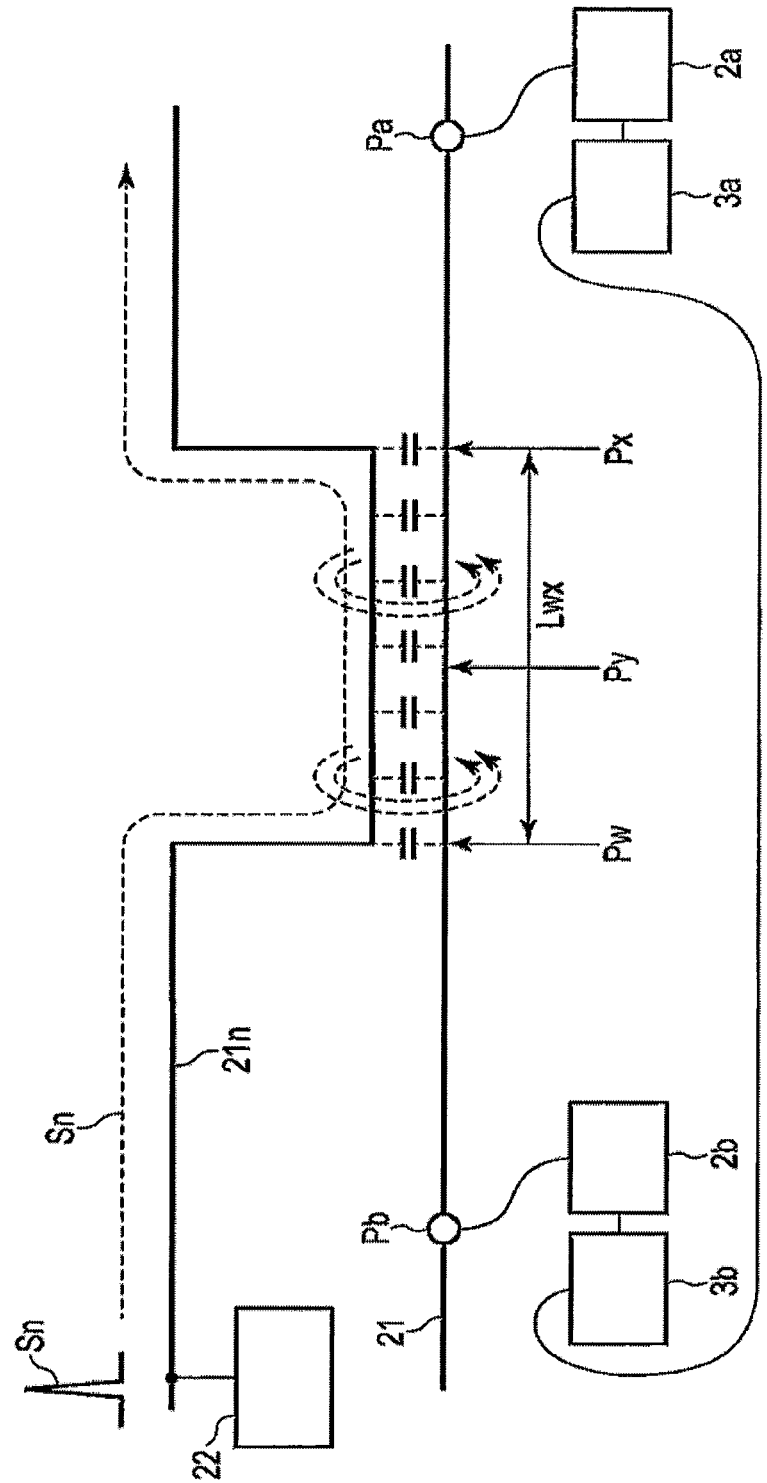
FIG. 8 is a configuration diagram illustrating a configuration in which the noise measurement apparatus according to a third embodiment of the present invention implements a measurement method.

FIG. 8 is a configuration diagram illustrating a configuration in which the noise measurement apparatus 1 according to a third embodiment of the present invention implements a measurement method. The configuration of the noise measurement apparatus 1 according to the present embodiment is similar to the configuration of the noise measurement apparatus 1 according to the first embodiment shown in FIG. 1. Therefore, FIG. 8 illustrates components necessary for describing the present embodiment and other components are omitted as appropriate. Suppose the electric wire 21 extends linearly and the distance in a direction perpendicular to the electric wire 21 can be ignored.

An electric wire 21n extends in parallel to the electric wire 21 on which the two voltage sensors 2a and 2b are set up, and the electric wire 21 includes a path between an observation point Pw and an observation point Px. A portion of the electric wire 21n extends in proximity to the path of the electric wire 21 at a distance at which electrostatic induction or electromagnetic induction (hereinafter, referred to as "induction") occurs. An observation point Py is located at a substantially middle position between the observation point Pw and the observation point Px. The noise source 22 is located outside a space between the two observation points Pw and Px of the electric wire 21n. A distance of the electric wire 21 between the observation point Pw and the observation point Px is assumed to be Lwx [m].

The noise Sn generated from the noise source 22 propagates through the electric wire 21n at the speed of light in a direction from the observation point Pw side toward the observation point Px side. A noise by induction Sni (hereinafter referred to as "induction noise Sni") is superimposed on the electric wire 21 for a time period after the noise Sn reaches the observation point Pw of the electric wire 21n until the noise Sn passes through the observation point Px. At the time point at which the noise Sn reaches the observation point Pw, the induction noise Sni superimposed on the electric wire 21 starts propagating from the observation point Pw of the electric wire 21 in both the direction of the observation point Px and a direction opposite thereto.

Figure 9:
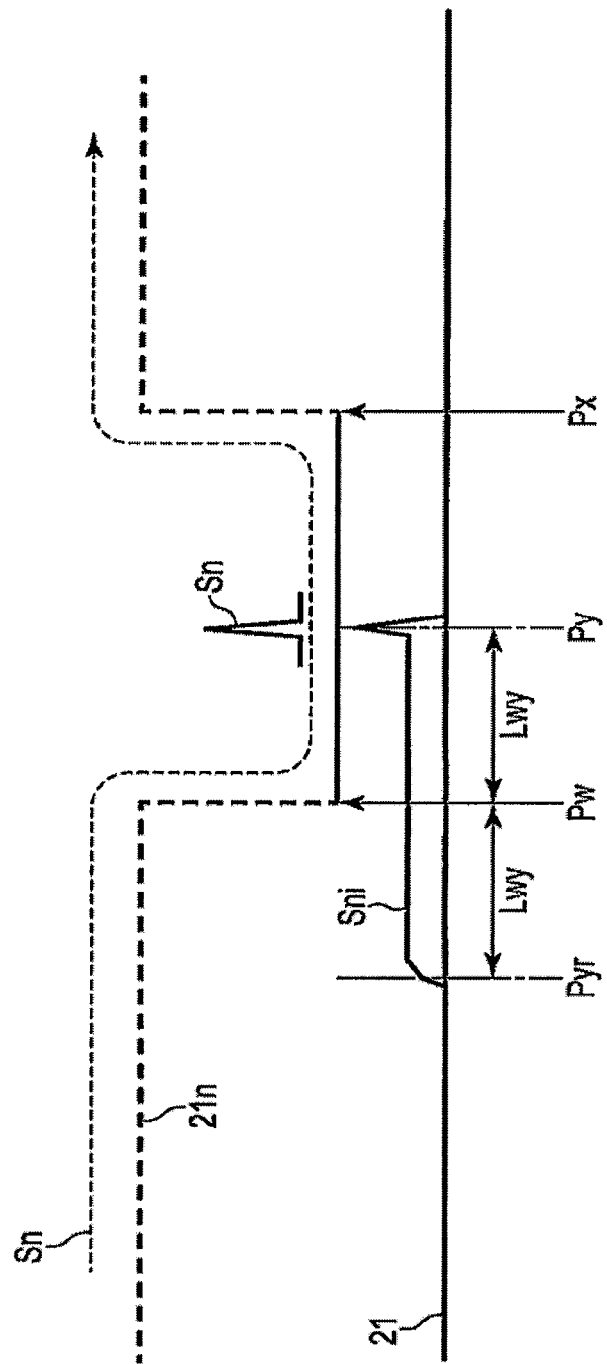
FIG. 9 is a conceptual diagram according to the third embodiment that conceptualizes a waveform showing a position of the induction noise at a time point at which the noise reaches a first observation point.

FIG. 9 is a conceptual diagram that conceptualizes a waveform showing a position of the induction noise Sni at a time point at which the noise Sn reaches the observation point Py.

At a time point at which the noise Sn reaches the observation point Py, a distal end of the induction noise Sni generated at the observation point Pw in a propagation direction of the noise Sn (direction of the observation point Px) reaches the observation point Py. At this time, the distal end of the induction noise Sni generated at the observation point Pw in the direction opposite to the propagation direction of the noise Sn reaches a point Pyr corresponding to the same distance as a distance Lwy between the observation point Pw and the observation point Py from the observation point Pw.

Figure 10:
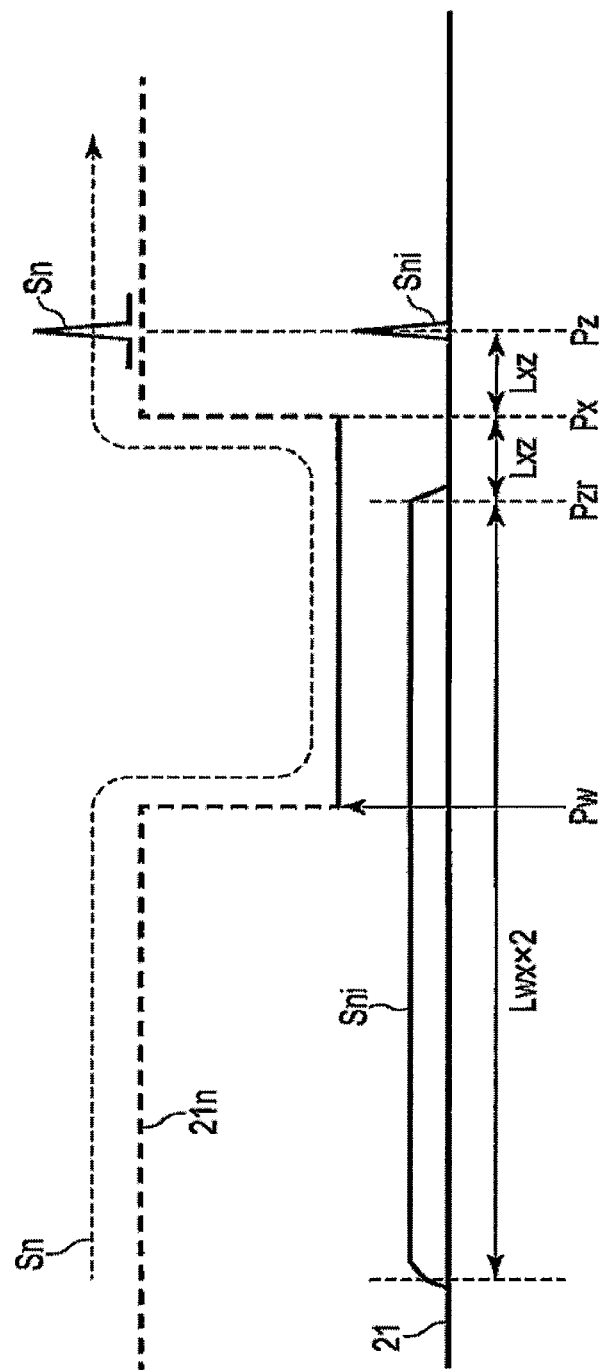
FIG. 10 is a conceptual diagram according to the third embodiment that conceptualizes a waveform indicating a position of the induction noise at a time point at which the noise reaches a second observation point.

FIG. 10 is a conceptual diagram that conceptualizes a waveform indicating a position of the induction noise Sni at a time point at which the noise Sn reaches an observation point Pz.

At a time point at which the noise Sn passes through the observation point Px, the induction noise Sni is generated in which a waveform whose width has the same length as a distance Lwx between the observation point Pw and the observation point Px extends in both directions from the observation point Pw. That is, the induction noise Sni having a waveform double the width of the distance Lwx is generated centered on the observation point Pw. The induction noise Sni is not generated in the electric wire 21 after the noise Sn passes through the observation point Px, which is an end point of the path in which the induction noise Sni is generated.

Therefore, at a time point at which the noise Sn reaches the observation point Pz, the induction noise Sni having a waveform double the width of the distance Lwx propagates in a direction opposite to the propagation direction of the noise Sn. A rear end of the induction noise Sni at this time is located at a point Pzr corresponding to the same distance as a distance Lxz between the observation point Px and the observation point Pz from the observation point Px.

On the other hand, the induction noise Sni that propagates in the same direction as the propagation direction of the noise Sn propagates at the same speed of light as that of the noise Sn. Thus, at a time point at which the noise Sn reaches the observation point Pz, waveforms of all the induction noises Sni generated during a time period between the two observation points Pw and Px at which induction occurs are located at the same position as that of the observation point Pz at which the noise Sn is located.

Thus, when the noise Sni by induction is generated during a certain path, the induction noise Sni propagates in the same direction as and in the direction opposite to the propagation direction of the original noise Sn which is the induction source, respectively. The induction noise Sni that propagates in the same direction as that of the original noise Sn has substantially the same waveform as that of the original noise Sn with only its form in the width direction being slightly deformed by induction. The induction noise Sni propagating in the direction opposite to the propagation direction of the original noise Sn has a length double the path in which induction occurs.

Therefore, at the voltage sensor 2a where the measurement location Pa is located in the same direction as the propagation direction of the original noise Sn, a noise signal (induction noise Sni) having a waveform similar to that of the original noise Sn is detected. At the voltage sensor 2b at which the measurement location Pb is located in the direction opposite to the propagation direction of the original noise Sn, a noise signal (induction noise Sni) is detected which lasts for a time period obtained by dividing the distance double the path in which induction occurs (the path between the two observation points Pw and Px) by the speed of light.

Furthermore, there may be a case where the noise signal cannot be detected noticeably by the voltage sensor 2b. Examples of the case where the noise signal cannot be detected noticeably include a case where noise signals are detected not consecutively but intermittently or a case where the detection level (voltage or the like) of the noise signal is low. Even in such cases, it may be determined that the voltage sensor 2b is located in a direction opposite to the propagation direction of the original noise Sn. Therefore, if the propagation direction of the original noise Sn is determined according to a difference in the waveform of noise signals detected by the two voltage sensors 2a and 2b, the determination can be made in any way.

When the noise source analysis apparatus 5 detects a noise signal having the aforementioned features, it is estimated that the noise signal is an induction noise Sni generated by induction in a certain path. For example, when a noise signal having a shorter width than a noise signal detected by the one voltage sensor 2b is detected by the other voltage sensor 2a, the noise source analysis apparatus 5 estimates that the noise signal is the induction noise Sni generated by induction in a certain path. In this case, the noise source analysis apparatus 5 estimates that the noise source 22 that generates the noise Sn inducing the induction noise Sni is located in a direction in which a wide noise signal of the electric wire 21n is detected on which the noise Sn is possibly superimposed.

According to the present embodiment, by measuring potentials at the two locations Pa and Pb of the electric wire 21 using the two voltage sensors 2a and 2b, it is possible to obtain information for identifying the position of the noise source 22 which is a cause of the induction noise Sni generated by induction in a certain path.

Fourth Embodiment

Figure 11:
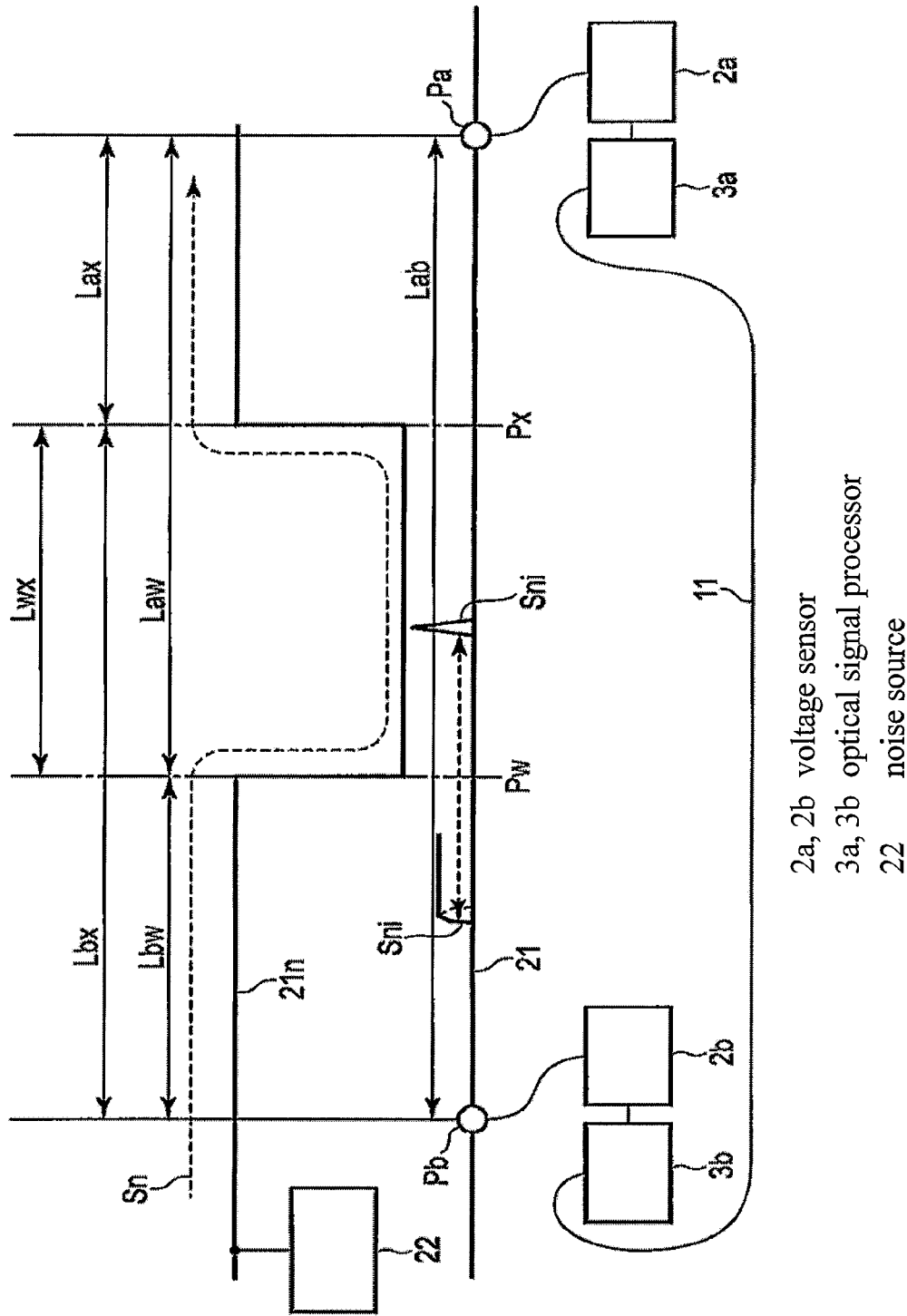
FIG. 11 is a configuration diagram illustrating a configuration in which the noise measurement apparatus according to a fourth embodiment of the present invention implements a measurement method.
Figure 12:
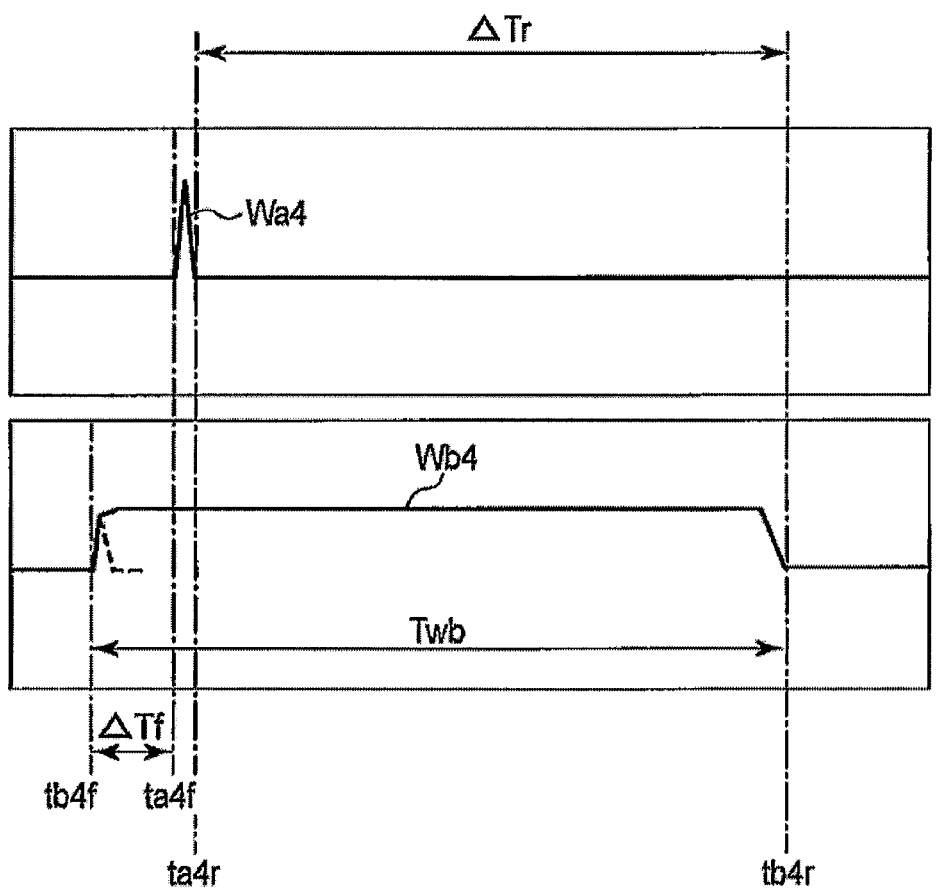
FIG. 12 is a waveform diagram illustrating waveforms of the induction noise respectively measured by the two voltage sensors according to the fourth embodiment on the same time coordinates.

FIG. 11 is a configuration diagram illustrating a configuration in which the noise measurement apparatus 1 according to a fourth embodiment of the present invention implements a measurement method. FIG. 11 mainly illustrates the induction noise Sni generated at the observation point Pw. FIG. 12 is a waveform diagram illustrating waveforms Wa4 and Wb4 of the induction noise Sni respectively measured by the two voltage sensors 2a and 2b on the same time coordinates.

The waveform Wa4 is voltage data measured by the voltage sensor 2a located far from the noise source 22. The waveform Wb4 is voltage data measured by the voltage sensor 2b located near the noise source 22.

A time ta4f indicates a time at which the voltage sensor 2a detects a distal end of the induction noise Sni (start time point of the noise signal) (time at which the potential at the measurement location Pa exceeds a threshold). A time ta4r indicates a time at which the voltage sensor 2a detects a rear end of the induction noise Sni (end time point of the noise signal) (time at which the potential at the measurement location Pa falls below a threshold). A time tb4f indicates a time at which the voltage sensor 2b detects a distal end of the induction noise Sni (start time point of the noise signal) (time at which the potential at the measurement location Pb exceeds a threshold). A time tb4r indicates a time at which the voltage sensor 2b detects a rear end of the induction noise Sni (end time point of the noise signal) (time at which the potential at the measurement location Pb falls below a threshold).

The mechanism whereby the induction noise Sni is generated is similar to that of the third embodiment, and so detailed description thereof is omitted.

The induction noise Sni generated at the observation point Pw propagates at the speed of light in the same direction as and in the direction opposite to the propagation direction of the noise Sn generated from the noise source 22.

The induction noise Sni generated at the observation point Pw which propagates in the same direction as the propagation direction of the noise Sn propagates superimposed on all the induction noise Sni generated thereafter. At this time, the time ta4f detected by the voltage sensor 2a is a time corresponding to a lapse of time required from the observation point Pw to the measurement location Pa of the voltage sensor 2a at the speed of light after the time at which the induction noise Sni is generated at the observation point Pw.

The induction noise Sni generated at the observation point Pw propagating in a direction opposite to the propagation direction of the noise Sn is detected by the voltage sensor 2b as a noise signal the earliest compared to the induction noise Sni generated thereafter. At this time, the time tb4f detected by the voltage sensor 2b is a time corresponding to a lapse of time required from the observation point. Pw to the measurement location Pb of the voltage sensor 2b at the speed of light after the time at which the induction noise Sni is generated at the observation point Pw.

The following equation holds when it is assumed that a time difference between times at which the two voltage sensors 2a and 2b detect distal ends of the waveforms Wa4 and Wb4 of the noise signal is $\Delta Tf$ ($=|tb4f-ta4f|$), a distance of the electric wire 21 between the measurement location Pb of the voltage sensor 2b and the observation point Pw is Lbw and a distance of the electric wire 21 between the measurement location Pa of the voltage sensor 2a and the observation point Pw is Law.

$$\Delta Tf=|Lbw-Law|/\text{speed of light} \qquad \text{Equation (3)}$$

Furthermore, the following equation holds when it is assumed that a distance between the measurement locations Pa and Pb of the two voltage sensors 2a and 2b is Lab.

$$Lbw+Law=Lab \qquad \text{Equation (4)}$$

Here, the distance Lab between the measurement locations Pa and Pb can be measured in advance.

Therefore, from the above two equations, it is possible to identify the position of the observation point Pw which is a start position of the path in which the induction noise Sni is induced.

The noise source analysis apparatus 5 estimates the start position of the path in which induction occurs based on the above-described method.

Next, the induction noise Sni generated at the observation point Px will be described. When the induction noise Sni is generated at the observation point Px, the induction noise Sni propagates in the same direction as and in the direction opposite to the propagation direction of the noise Sn at the speed of light as in the case where the induction noise Sni is generated at the observation point Pw.

The induction noise Sni which is generated at the observation point Px and propagates in the same direction as that of the noise Sn propagates superimposed on all the induction noises Sni generated after the observation point Pw. At this time, the time ta4r detected by the voltage sensor 2a is a time corresponding to a lapse of time required from the observation point Px to the measurement location Pa of the voltage sensor 2a at the speed of light after the time at which the induction noise Sni is generated at the observation point Px.

The induction noise Sni which is generated at the observation point Px and propagates in the direction opposite to the propagation direction of the noise Sn is detected as a noise signal indicating an end of the induction noise Sni generated in the path in which induction occurs. At this time, the time tb4r at which the induction noise Sni is detected by the voltage sensor 2b is a time corresponding to a lapse of time required from the observation point Px to the measurement location Pb of the voltage sensor 2b at the speed of light after the time at which the induction noise Sni is generated at the observation point Px.

The following equation holds when it is assumed that a time difference between times at which the two voltage sensors 2a and 2b detect rear ends of the waveforms Wa4 and Wb4 of the noise signal is $\Delta Tr$ ($=|tb4r-ta4r|$), a distance of the electric wire 21 between the measurement location Pb of the voltage sensor 2b and the observation point Px is Lbx and a distance of the electric wire 21 between the measurement location Pa of the voltage sensor 2a and the observation point Px is Lax.

$$\Delta Tr=|Lbx-Lax|/\text{speed of light} \qquad \text{Equation (5)}$$

Furthermore, the following equation holds when a distance between the measurement locations Pa and Pb of the two voltage sensors 2a and 2b is assumed to be Lab.

$$Lbx+Lax=Lab \qquad \text{Equation (6)}$$

Therefore, from the above-described two equations, it is possible to identify the position of the observation point Px which is an end position of the path in which the induction noise Sni is induced.

The noise source analysis apparatus 5 estimates the position of an end of the path in which induction occurs based on the above-described method. Note that the noise source analysis apparatus 5 may also have a configuration in which only one of the start position and the end position of the path in which induction occurs is estimated.

Furthermore, a time width Twb of the waveform of the induction noise Sni detected by the voltage sensor 2b is calculated from the following equation.

$$Twb=|tb4r-tb4f| \qquad \text{Equation (7)}$$

Here, the width of the induction noise Sni which propagates in the direction opposite to the propagation direction of the noise Sn and is detected by the voltage sensor 2b is double the distance Lwx corresponding to the path in which induction occurs as described in the third embodiment. Therefore, the distance Lwx corresponding to the path in which induction occurs is calculated from the following equation.

$$Lwx=(Twb/2)\times\text{speed of light} \qquad \text{Equation (8)}$$

From the above equation, the noise source analysis apparatus 5 estimates the distance Lwx corresponding to the path in which induction occurs.

Note that the waveform Wb4 measured by the voltage sensor 2b is clearly illustrated for convenience of description here, but the waveform Wb4 need not always be clearly illustrated. Information on the path in which induction occurs can be obtained as long as one of the distal end and the rear end of the waveform Wb4 can be recognized.

According to the present embodiment, it is possible to obtain information for identifying the position of the path in which the induction noise Sni is induced.

Fifth Embodiment

Figure 13:
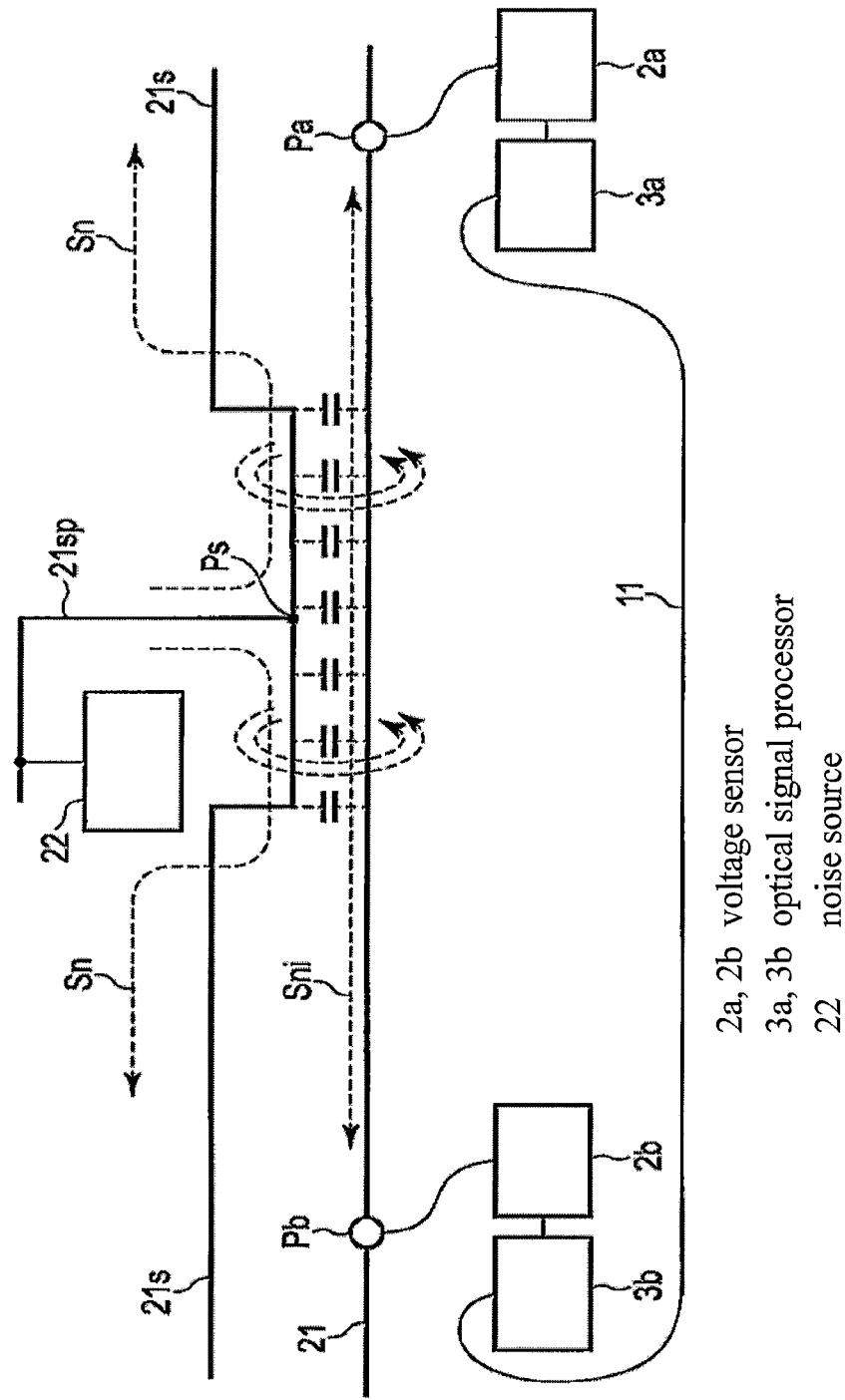
FIG. 13 is a configuration diagram illustrating a configuration in which the noise measurement apparatus according to a fifth embodiment of the present invention implements a measurement method.

FIG. 13 is a configuration diagram illustrating a configuration in which the noise measurement apparatus 1 according to a fifth embodiment of the present invention implements a measurement method. The configuration of the noise measurement apparatus 1 according to the present embodiment is similar to the configuration of the noise measurement apparatus 1 according to the first embodiment shown in FIG. 1. Therefore, FIG. 13 shows components necessary for describing the present embodiment and other components are omitted as appropriate.

An electric wire 21s corresponds to the electric wire 21n according to the third embodiment shown in FIG. 8 from which an electric wire 21sp to which the noise source 22 is connected is branched at a branch point Ps within the path in which induction occurs in the electric wire 21. The noise Sn generated from the noise source 22 propagates toward the two directions of the electric wire 21s respectively at the branch point Ps of the electric wire 21s. Therefore, the induction noise Sni is generated by two noises Sn branched at the branch point Ps of the electric wire 21s within the path in which induction of the electric wire 21 occurs.

The noise signal indicating such an induction noise Sni has substantially no features such as the width of the waveform described in the third embodiment or fourth embodiment. Therefore, not much useful information on the noise source 22 can be obtained using the analysis methods of the noise source 22 according to the third embodiment and the fourth embodiment.

Thus, the noise source analysis apparatus 5 executes the analysis method according to the first embodiment or the second embodiment. Here, the analysis method according to the first embodiment or the second embodiment is based on the assumption that the electric wire 21 from which the voltage sensors 2a and 2b detect a voltage (potential) includes the noise source 22. In the present embodiment, the analysis result obtained is used to identify the position of the branch point Ps located within the path as shown in FIG. 13 during which induction of the electric wire 21s occurs instead of identifying the position of the noise source 22.

Even when the path in which induction occurs is short, almost no features described in the third embodiment or fourth embodiment appear in the induction noise Sni. In such a case, the analysis result of the analysis method according to the first embodiment or the second embodiment can be used to identify the position of the path in which induction occurs.

The present embodiment adopts the analysis method according to the first embodiment or the second embodiment, and can thereby obtain information for identifying the position of the noise source 22 which becomes a cause of the induction noise Sni.

Sixth Embodiment

Figure 14:
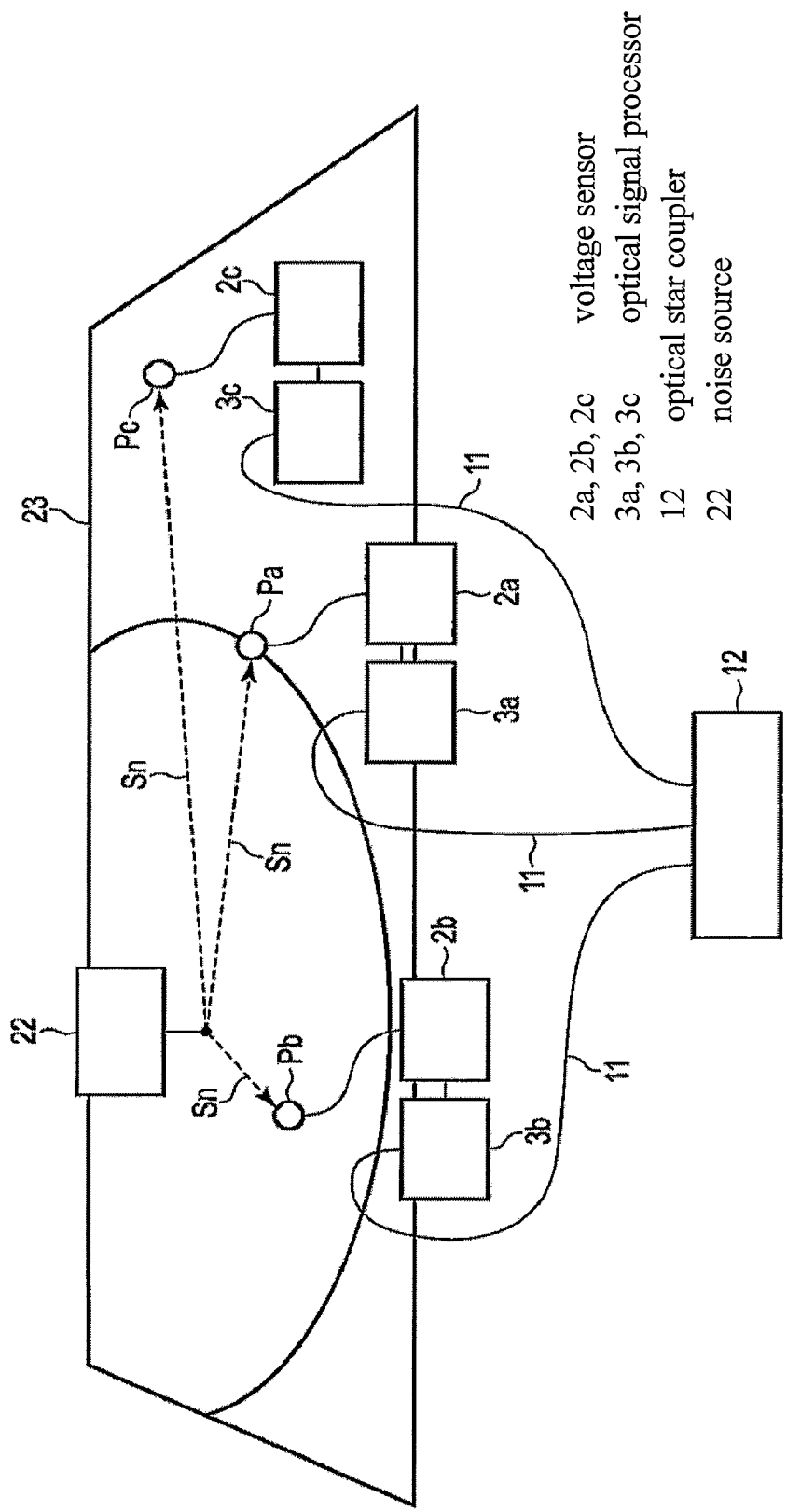
FIG. 14 is a configuration diagram illustrating a configuration in which the noise measurement apparatus according to a sixth embodiment of the present invention implements a measurement method.

FIG. 14 is a configuration diagram illustrating a configuration in which the noise measurement apparatus 1 according to a sixth embodiment of the present invention implements a measurement method. The configuration of the noise measurement apparatus 1 according to the present embodiment is similar to the configuration of the noise measurement apparatus 1 according to the first embodiment shown in FIG. 1 except in that a voltage sensor 2c and an optical signal processor 3c are added. Therefore, FIG. 14 shows components necessary for describing the present embodiment and other components are omitted as appropriate.

The noise source 22 is located on a planar conductive plate 23. The planar conductive plate 23 is, for example, a ground surface disposed in a mesh-like pattern on the floor surface or a solid common surface within an electronic substrate. The noise Sn generated from the noise source 22 propagates concentrically around the noise source 22 at the speed of light.

Measurement locations Pa, Pb and Pc of respective voltage sensors 2a, 2b and 2c are on the conductive plate 23. The voltage sensor 2c and the optical signal processor 3c are similar to the voltage sensors 2a and 2b and the optical signal processors 3a and 3b described in the first embodiment. The optical signal processors 3a to 3c transmit/receive signals to take time-synchronization among all the voltage sensors 2a to 2c all the time as in the case of the first embodiment. Note that the configurations of the three voltage sensors 2a to 2c will be described here, but the number of voltage sensors 2a to 2c can be any number equal to or greater than 3.

Figure 15:
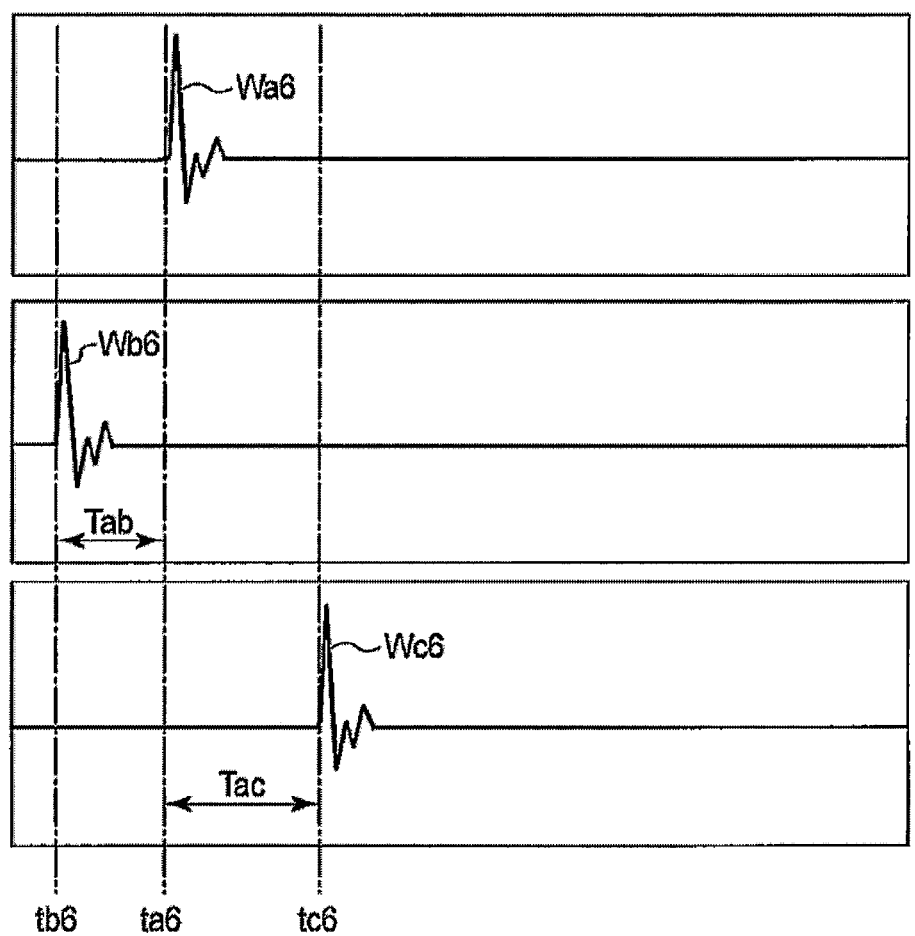
FIG. 15 is a waveform diagram showing waveforms of the noise respectively measured by the voltage sensors according to the sixth embodiment on the same time coordinates.
Figure 16:
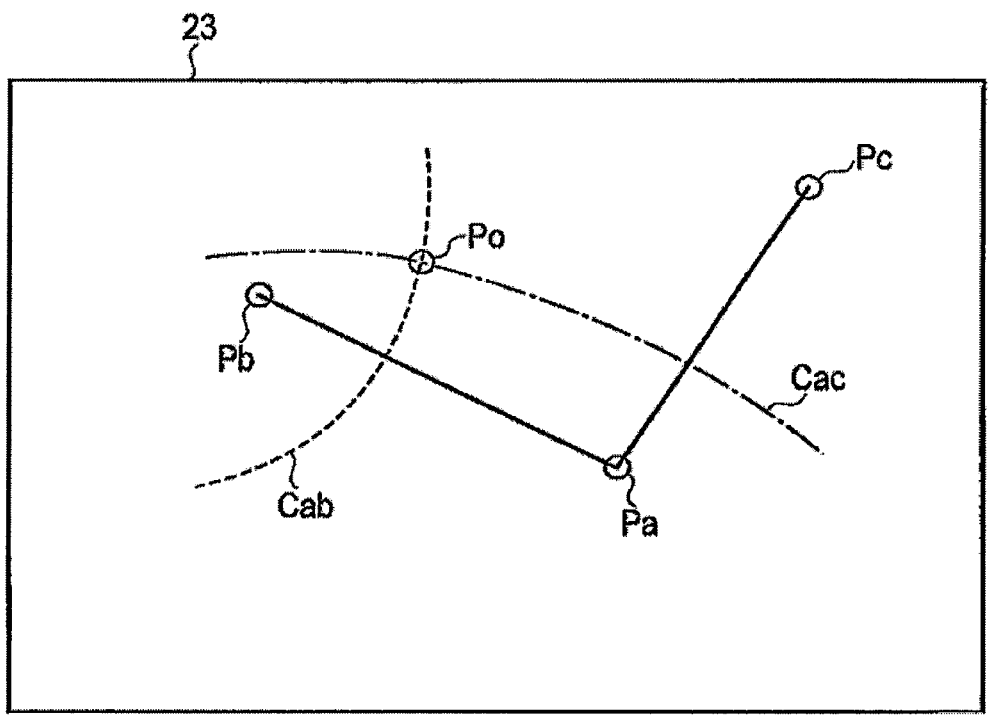
FIG. 16 is a conceptual diagram showing the analysis method of the noise source by the noise source analysis apparatus according to the sixth embodiment.

FIG. 15 is a waveform diagram showing waveforms Wa6, Wb6 and Wc6 of the noise Sn respectively measured by the voltage sensors 2a, 2b and 2c according to the present embodiment on the same time coordinates. FIG. 16 is a conceptual diagram showing the analysis method of the noise source 22 by the noise source analysis apparatus 5 according to the present embodiment.

Here, times ta6, tb6 and tc6 are times at which the voltage sensors 2a, 2b and 2c detect the noise Sn respectively. A time period Tab is a time difference between the time ta6 and the time tb6. A time period Tac is a time difference between the time ta6 and the time tc6.

The times ta6 to tc6 at which the respective voltage sensors 2a to 2c detect the noise Sn differ according to distances between the measurement locations Pa to Pc, and the noise source 22. The time tb6 detected by the voltage sensor 2b at the measurement location Pb nearest to the noise source 22 is the earliest. The time tc6 detected by the voltage sensor 2c at the measurement location Pc farthest from the noise source 22 is the latest.

Next, the analysis method of the noise source 22 by the noise source analysis apparatus 5 will be described with reference to FIG. 16.

A track Cab is obtained which is a set of points at which a time difference between the time required to reach the measurement location Pa of the voltage sensor 2a at the speed of light and the time required to reach the measurement location Pb of the voltage sensor 2b at the speed of light becomes a time period Tab. Furthermore, a track Cac is obtained which is a set of points at which a time difference between the time required to reach the measurement location Pa of the voltage sensor 2a at the speed of light and the time required to reach the measurement location Pc of the voltage sensor 2c at the speed of light becomes a time period Tac. A point of intersection Po between the two tracks Cab and Cac calculated in this way becomes the position at which the noise source 22 is estimated to be located.

In this way, the noise source analysis apparatus 5 identifies the position of the noise source 22.

According to the present embodiment, the three voltage sensors 2a to 2c measure the potentials at three locations Pa to Pc of the planar conductive plate 23, and can thereby obtain information for identifying the position of the noise source 22 located at an arbitrary position of the conductive plate 23.

Seventh Embodiment

Figure 17:
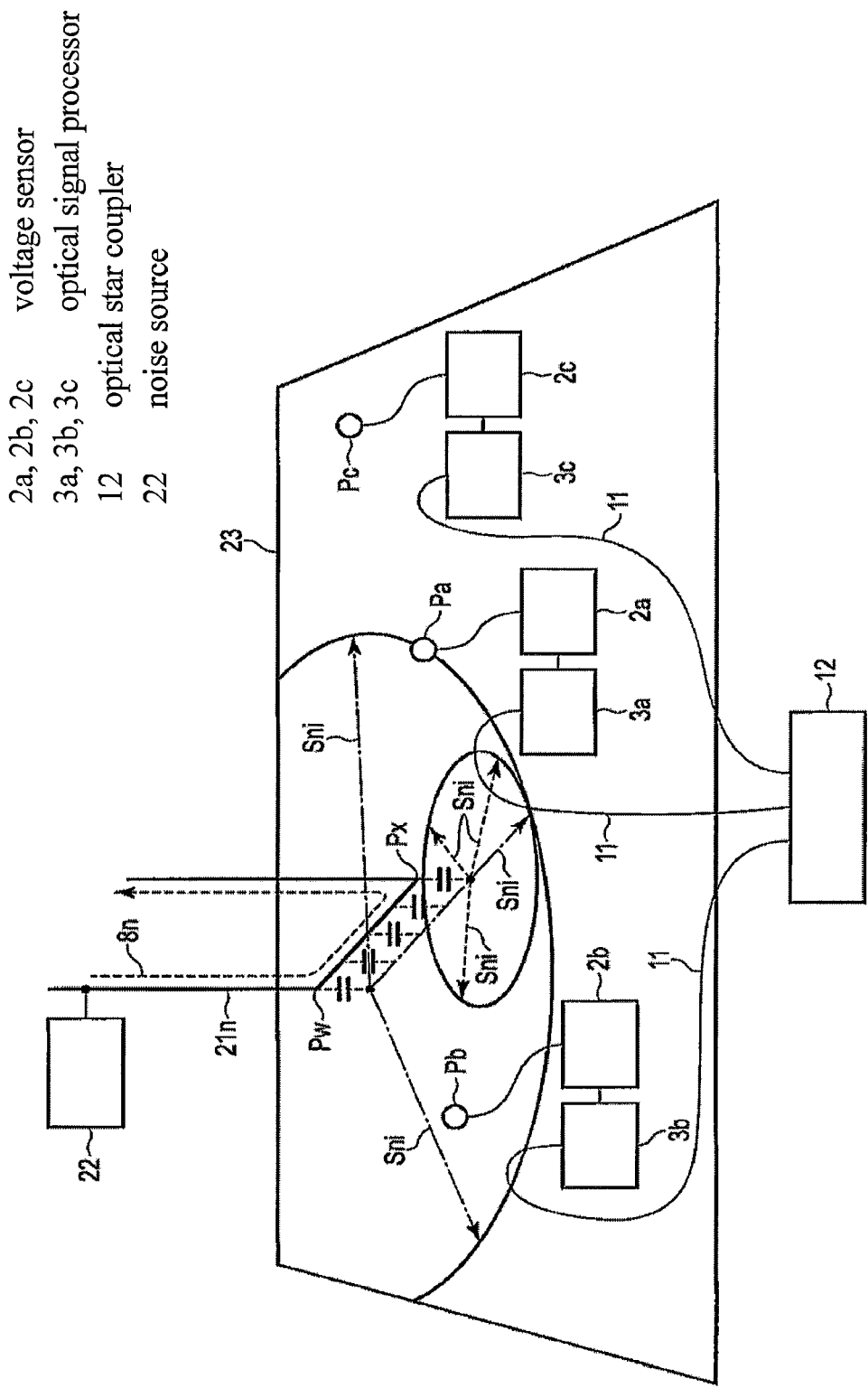
FIG. 17 is a configuration diagram illustrating a configuration in which the noise measurement apparatus according to a seventh embodiment of the present invention implements a measurement method.

FIG. 17 is a configuration diagram illustrating a configuration in which the noise measurement apparatus 1 according to a seventh embodiment of the present invention implements a measurement method. The configuration according to the present embodiment is similar to the configuration according to the sixth embodiment shown in FIG. 14. Therefore, parts different from those in the sixth embodiment will be mainly described.

The electric wire 21n is an electric wire on which the noise source 22 is located. The electric wire 21n is in proximity to the conductive plate 23 on which the three voltage sensors 2a to 2c are set up in a space between the observation point Pw and the observation point Px at such a distance at which induction occurs.

The noise Sn generated from the noise source 22 propagates through the electric wire 21n at the speed of light. The induction noise Sni is superimposed on the conductive plate 23 through induction of the noise Sn after the noise Sn reaches the observation point Pw of the electric wire 21n until it passes through the observation point Px. The induction noise Sni propagates concentrically around the point at which the induction noise Sni is superimposed on the conductive plate 23 at the speed of light. Therefore, the induction noise Sni spreads concentrically from points linearly arranged in a space from the observation point Pw to the observation point Px on the conductive plate 23 in proximity to the electric wire 21n as starting points.

At an arbitrary point on the conductive plate 23, the induction noise Sni propagating from the observation point Pw arrives earlier than the induction noise Sni propagating from the observation point Px. For this reason, the induction noise Sni detected at an arbitrary point on the conductive plate 23 has a waveform having a time width that continues from the time point at which the induction noise Sni propagating from the observation point Pw is detected to the time point at which the induction noise Sni propagating from the observation point Px is detected.

Figure 18:
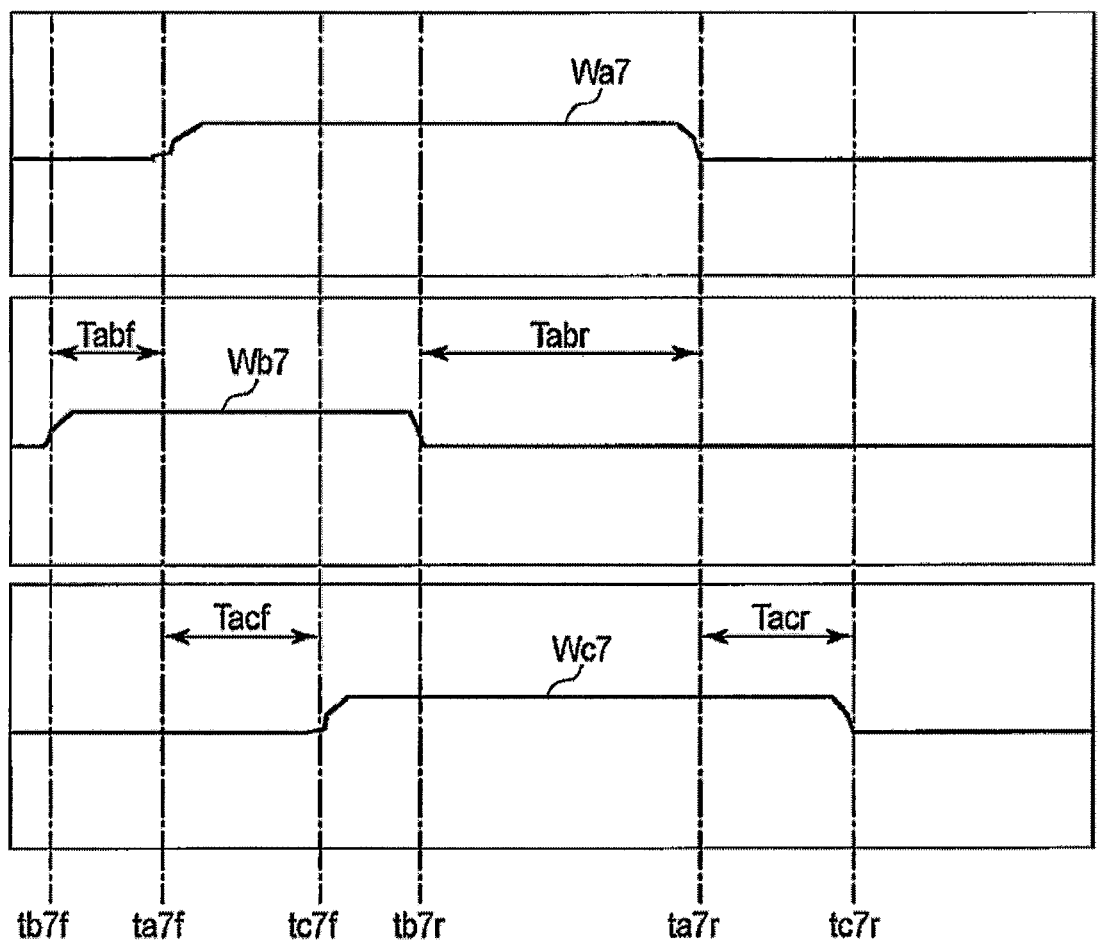
FIG. 18 is a waveform diagram showing waveforms of the induction noise respectively measured by the voltage sensors according to the seventh embodiment on the same time coordinates.

FIG. 18 is a waveform diagram showing waveforms Wa7, Wb7 and Wc7 of the induction noise Sni respectively measured by the voltage sensors 2a, 2b and 2c according to the present embodiment on the same time coordinates.

Times ta7f to tc7f at which the respective voltage sensors 2a to 2c first detect the waveforms Wa7 to Wc7 of the induction noise Sni (times at which the induction noise Sni is located at distal ends of the respective Wa7 to Wc7) correspond to times at which the induction noise Sni propagating from the observation point Pw is detected.

A time difference Tabf between the times ta7f and 7b7f at which the induction noise Sni propagating from the observation point Pw is detected by the two voltage sensors 2a and 2b respectively is calculated from the waveforms Wa7 and Wb7 respectively measured by the two voltage sensors 2a and 2b. Furthermore, a time difference Tacf between the times ta7f and tc7f at which the induction noise Sni propagating from the observation point Pw is detected by the two voltage sensors 2a and 2c is calculated from the waveforms Wa7 and Wc7 respectively measured by the two voltage sensors 2a and 2c, which is a different combination.

The position of the observation point Pw is estimated through calculation processing similar to that in the sixth embodiment from the two time differences Tabf and Tacf determined in this way.

Times at which the respective voltage sensors 2a to 2c lastly detect the waveforms Wa7 to Wc7 of the induction noise Sni respectively (times at which the induction noise Sni is located at positions of the rear ends of respective Wa7 to Wc7) ta7r to tc7r are times at which induction noise Sni propagating from the observation point Px is detected.

A time difference Tabr between times ta7r and 7b7r at which the two voltage sensors 2a and 2b detect the induction noise Sni propagating from the observation point Px is calculated from the respective waveforms Wa7 and Wb7 measured by the two voltage sensors 2a and 2b. Furthermore, a time difference Tacr between the times ta7r and tc7r at which the induction noise Sni propagating from the observation point Pw is detected by the two voltage sensors 2a and 2c is calculated from the waveforms Wa7 and Wc7 measured by the two voltage sensors 2a and 2c, which is a different combination.

The position of the observation point Px is estimated through calculation processing similar to that in the sixth embodiment from the two time differences Tabr and Tacr calculated in this way.

In this way, the noise source analysis apparatus 5 estimates locations at which the induction noise Sni is generated to identify the noise source 22.

According to the present embodiment, the three voltage sensors 2a to 2c measure the potentials at the three locations Pa to Pc of the planar conductive plate 23 and thereby identify locations at which the induction noise Sni is superimposed on the conductive plate 23.

Eighth Embodiment

Figure 19:
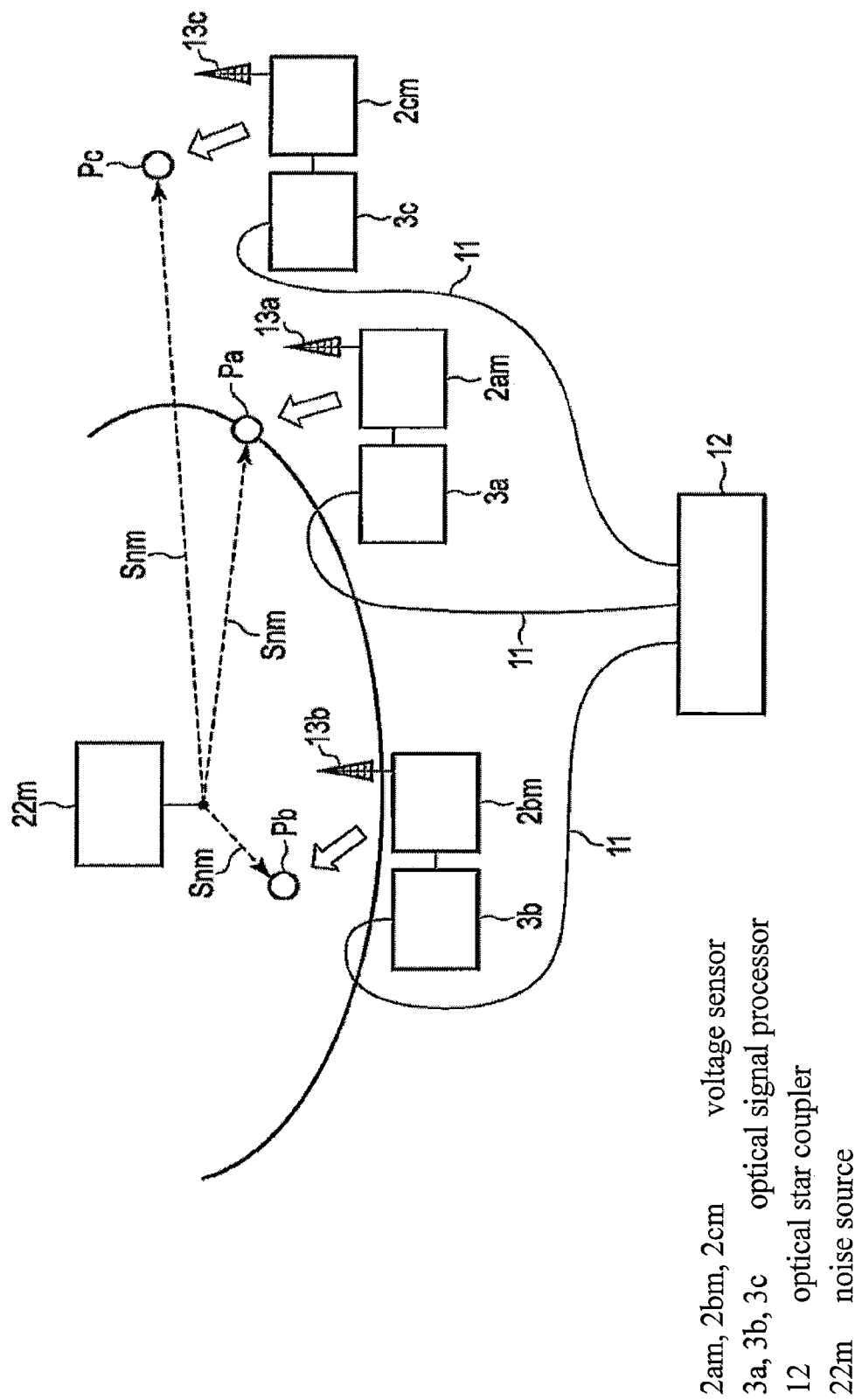
FIG. 19 is a configuration diagram illustrating a configuration in which the noise measurement apparatus according to an eighth embodiment of the present invention implements a measurement method.

FIG. 19 is a configuration diagram illustrating a configuration in which the noise measurement apparatus 1 according to an eighth embodiment of the present invention implements a measurement method. The configuration according to the present embodiment is similar to the configuration according to the sixth embodiment shown in FIG. 14, and so different parts will be mainly described.

A noise source 22m transmits an electromagnetic noise Snm into a space. Examples of the noise source 22m include a radio wave source of illegal radio waves transmitted into the space or a wiring section of a high-voltage device that generates high-frequency noises.

Each voltage sensor 2am, 2bm or 2cm is equipped with an electromagnetic field probe 13a, 13b or 13c respectively. In other aspects, the voltage sensors 2am to 2cm are similar to the voltage sensors 2a to 2c according to the sixth embodiment. Thus, the voltage sensors 2am to 2cm measure the electromagnetic noise Snm at three different locations Pa to Pc in the space respectively. Note that any sensor can be used if it allows the electromagnetic noise Snm to be measured. Since the electromagnetic noise Snm does not propagate over a plane, the measurement locations Pa to Pc of the three voltage sensors 2am to 2cm need not be located on the same plane and can be at any position in the space.

Figure 20:
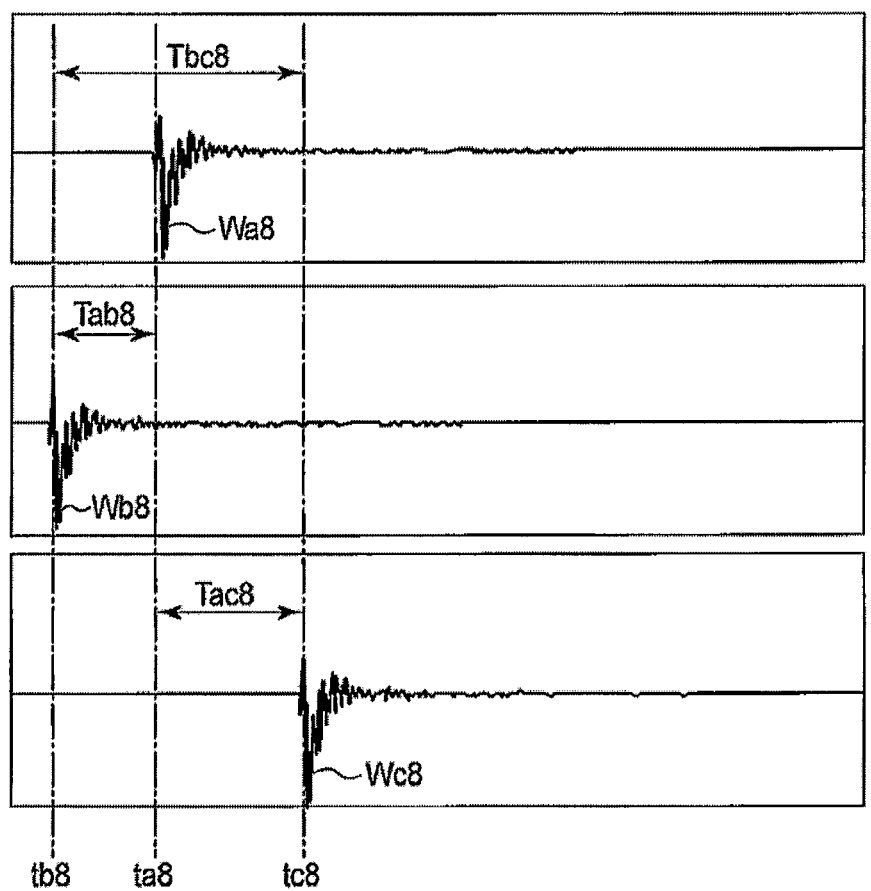
FIG. 20 is a waveform diagram showing waveforms of the electromagnetic noise respectively measured by the voltage sensors according to the eighth embodiment on the same time coordinates.

FIG. 20 is a waveform diagram showing waveforms Wa8, Wb8 and Wc8 of the electromagnetic noise Snm respectively measured by the voltage sensors 2am, 2bm and 2cm according to the present embodiment on the same time coordinates.

Times ta8, tb8 and tc8 here are times at which the voltage sensors 2am, 2bm and 2cm detect the electromagnetic noise Snm respectively. A time period Tab8 is a time difference between the time ta8 and the time tb8. A time period Tac8 is a time difference between the time ta8 and the time tc8. A time period Tbc8 is a time difference between the time tb8 and the time tc8.

As in the case of the sixth embodiment, the noise source analysis apparatus 5 identifies the position of the noise source 22m based on the respective measurement locations Pa to Pc of the voltage sensors 2am to 2cm and the two times Tab8 and Tac8 shown in FIG. 20. The electromagnetic noise Snm here propagates through the space, and so the speed of light is calculated as 0.3 [m/ns]. The noise source analysis apparatus 5 may identify the position of the noise source 22m using another time period Tbc8. Thus, the position of the noise source 22m can be identified by further limiting the range in which the noise source 22m is located.

According to the present embodiment, the three sensors 2am to 2cm measure the electromagnetic noise Snm at the three locations Pa to Pc in a certain space, and can thereby obtain information for identifying the position of the noise source 22m at an arbitrary position in the space.

Note that in each embodiment, the noise source analysis apparatus 5 may also be configured so as to execute analyses according to some embodiments if it is configured so as to execute an analysis according to at least its own embodiment.

Note that the present invention is not limited to the above-described embodiments, but may be implemented by modifying components without departing from the spirit and scope of the present invention in an implementation stage. Furthermore, various inventions can be formed by combining a plurality of components disclosed in the above-described embodiments as appropriate. For example, several components may be deleted from among all the components disclosed in the embodiments. Furthermore, components among different embodiments may be combined as appropriate.

The invention claimed is:

1. A noise source analysis method comprising:
    measuring a noise using a plurality of sensors which are time-synchronized with each other;
    making an analysis to identify a noise source which is a cause of the noise based on data of the noise measured by the plurality of sensors, wherein the analysis is to determine that the noise is generated by induction of an original noise based on a waveform of the noise measured by the plurality of sensors, the induction being caused by wires; and
    determining whether or not the noise is generated by the induction based on the waveform of the noise.

2. The noise source analysis method according to claim 1, wherein the analysis is to determine whether or not the noise source is located in a space between detection locations of the plurality of sensors based on a time difference between times at which the noise is measured by the plurality of sensors respectively and a distance between the detection locations of the plurality of sensors.

3. The noise source analysis method according to claim 1, wherein the analysis is to determine a position of the noise source located in a space between detection locations of the plurality of sensors based on a time difference between times at which the noise is measured by the plurality of sensors respectively and a distance between the detection locations of the plurality of sensors.

4. The noise source analysis method according to claim 1, wherein the analysis is to determine a position at which the original noise causes the noise to be generated by the induction based on a time difference between times at which the noise is measured by the plurality of sensors respectively and a distance between detection locations of the plurality of sensors.

5. The noise source analysis method according to claim 1, wherein the analysis is to determine a propagation direction of the noise based on times at which the plurality of sensors measure the noise.

6. The noise source analysis method according to claim 1, wherein the analysis is to determine a propagation direction of the original noise of induced noise based on the waveform of noise.

7. The noise source analysis method according to claim 1, wherein the analysis is to determine a position at which the original noise causes the noise to be generated by the induction based on a difference in times at which the plurality of sensors measure the noise respectively and a distance between detection locations by the plurality of sensors.

8. The noise source analysis method according to claim 1, wherein the analysis is to determine a distance of a section of the wires where the original noise causes the noise by the induction based on the waveform of the noise.

9. The noise source analysis method according to claim 1, wherein the plurality of sensors measure the noise at least at three locations, and
    the analysis is to determine a position of the noise source based on at least two time differences between times at which the plurality of sensors measure the noise respectively.

10. The noise source analysis method according to claim 1, wherein the plurality of sensors measure the noise at least at three locations, and
    the analysis is to determine a position at which the original noise causes the noise to be generated by the induction based on at least two time differences between times at which the plurality of sensors measure the noise respectively.

11. A noise source analysis apparatus comprising:
    a plurality of sensors that are time-synchronized with each other to measure a noise; and
    analysis means for making an analysis to identify a noise source which is a cause of the noise based on data of the noise measured by the plurality of sensors respectively, wherein the analysis is to determine that the noise is generated by induction of an original noise based on a waveform of the noise measured by the plurality of sensors, the induction being caused by wires, the analysis means for determining whether or not the noise is generated by the induction based on the waveform of the noise.

* * * * *